United States Patent
Wada et al.

(10) Patent No.: US 6,440,282 B1
(45) Date of Patent: Aug. 27, 2002

(54) SPUTTERING REACTOR AND METHOD OF USING AN UNBALANCED MAGNETRON

(75) Inventors: Yuichi Wada; Hisashi Aida; Kihwan Yoon, all of Narita (JP)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/607,694

(22) Filed: Jun. 30, 2000

(30) Foreign Application Priority Data

Jul. 6, 1999 (JP) .......................................... 11-191712
Jul. 6, 1999 (JP) .......................................... 11-191717

(51) Int. Cl.[7] .............................................. C23C 14/35
(52) U.S. Cl. .............................. 204/298.2; 204/298.17; 204/298.19
(58) Field of Search ....................... 204/298.16, 298.17, 204/298.19, 298.2

(56) References Cited

U.S. PATENT DOCUMENTS

| 4,746,417 A | 5/1988 | Ferenbach et al. ........... 204/298 |
| 4,872,964 A | 10/1989 | Suzuki et al. ............... 204/298 |
| 5,248,402 A | 9/1993 | Ballentine et al. ........ 204/298.2 |
| 5,284,564 A | 2/1994 | Maass ...................... 204/298.2 |
| 5,320,728 A | 6/1994 | Tepman .................. 204/192.12 |
| 5,374,343 A | * 12/1994 | Sasaki et al. ............. 204/298.2 |
| 5,746,897 A | 5/1998 | Heimanson et al. ...... 204/298.2 |
| 5,770,025 A | 6/1998 | Kiyota ..................... 204/298.2 |
| 5,795,451 A | 8/1998 | Tan et al. ................. 204/298.2 |

FOREIGN PATENT DOCUMENTS

| JP | 63-282263 | 11/1988 | ............ C23C/14/16 |
| JP | 7-252651 | 10/1995 | ............ C23C/14/35 |
| JP | 9-41135 | 2/1997 | ............ C23C/14/35 |

OTHER PUBLICATIONS

Musil et al., Unbalanced Magnetron and New Sputtering System Enhanced Plasma Ionization, J. Vac. Sci. Technology A, vol. 9, No. 3, pp. 1171–1177.

* cited by examiner

*Primary Examiner*—Steven H. VerSteeg
(74) *Attorney, Agent, or Firm*—Charles S. Guenzer

(57) ABSTRACT

In a sputtering device which has a small rotatable magnetron (30) arranged opposite a target 16, the magnetron (30) has a first magnet band (44) and a second magnet opposite a target 16, the magnetron (30) has a first magnet band (44) and a second magnet a greater total magnetic flux. Some of the lines of magnetic flux from the second magnet band (42) pass through the first magnet band (44) and terminate at the second magnet band (42). The remaining lines of magnetic flux from the second magnet band (42) form a magnetic flux loop that encloses the first magnet band (44) and that terminates at the second magnet band (42). The outer band is preferably in an oval shape having a minor axis no smaller than 0.8 of the major axis, and more preferably in a circular shape.

32 Claims, 13 Drawing Sheets

SPUTTERING REACTOR AND METHOD OF USING AN UNBALANCED MAGNETRON

FIELD OF THE INVENTION

The invention relates generally to magnetron sputtering. In particular, the invention relates to the configuration and placement of a rotatable magnetron.

BACKGROUND ART

A plasma sputter reactor typically includes a sputtering target, a water support pedestal which is arranged to face the consumable erosion surface of the sputtering target, and a magnetron which is arranged to face the back surface of the sputtering target. A magnetron creates a magnetic field adjacent to the erosion surface of the target to increase the plasma density and hence the sputtering rate. A working gas, such as argon, is fed into the vacuum chamber of the sputter reactor to generate a plasma near the sputtering target. Particles sputtered from the sputtering target reach the wafer to form a film.

The continuing development of miniaturized semiconductor devices has prompted a strong demand for full coverage at the bottom of inter-level connection holes, known as via or contact holes, having a high aspect ratio. In order to meet this demand, the present inventors have studied methods for improving the bottom coverage within the hole achievable by sputtering.

It is also important to improve the in-plane uniformity of the thickness of a film formed on a substrate by sputtering. For example, accompanying the development of large glass substrates for liquid-crystal and large semiconductor wafers, as exemplified in the transition from 200 mm to 300 mm wafers, there has been a great demand to further improve the in-plane uniformity of film thickness.

Accordingly, it is desired to provide a sputter reactor and a sputtering deposition method for improved bottom coverage.

It is also desired to provide a sputtering reactor and a sputtering deposition method for improved in-plane uniformity of film thickness.

In addition to the uniform sputter deposition, it is also desired to uniformly sputter the erosion surface of the target to maximize target utilization.

SUMMARY OF THE INVENTION

The invention includes a magnetron sputtering reactor and a method of sputtering in which a magnetron is positioned at the back of a target composed of a material to be sputtered. The magnetron is rotated about the center of the target to provide uniform sputtering and sputter deposition.

According to one aspect of the invention, the magnetron includes an outer magnet band of one polarity enclosing an inner magnet band of the opposite polarity. Preferably, the inner magnet band encloses an aperture free of permanently magnetized material, although an aperture-free inner band is preferred in some configurations. Each of the bands may be formed of a single magnet or of multiple magnets arranged in substantially parallel band shapes. A magnetic yoke may support the magnets of both bands and magnetically couple the bands of opposed polarity. In the case of a band being composed of multiple magnets, a magnetic pole face having a band shape may be positioned on the ends of the magnets opposite the yoke and magnetically couple the magnets of the same polarity, thereby bridging the region between the discrete magnets.

According to a second aspect of the invention, the magnetron is unbalanced and the total magnetic flux produced by the outer magnet band is greater, preferably by a factor of at least 1.5, than the total magnetic flux produced by the inner band. Thereby, the magnetic field may be projected toward substrate being sputter coated.

According to a third aspect of the invention, the magnetron is substantially confined to one side of the rotation shaft positioned at the center of the target and rotating the magnetron about the target center. Excursions of the magnetron to the other side are limited to small fractions of the target radius, for example, 15%. Preferably, the outer magnet band overlies the target center.

According to a fourth aspect of the invention, the curvature of the shape of the small-area magnetron is limited. Such shapes include circles and ovals having ratios of the minor axis to the major axis of at least 0.8. The oval's major axis is preferably arranged along a target radius, but other orientations are possible. However, the invention may also be applied to other shapes of magnetrons, including triangles, arced triangles, and racetracks having parallel bands extending from near the target center to near the target periphery.

According to a fifth aspect of the invention, the magnetron includes nested pairs of magnet bands.

According to a sixth aspect of the invention, the magnetron may be formed of cylindrical magnets of one magnetic polarity arranged in an outer band having an oval or circular shape and cylindrical magnets of the other magnetic polarity arranged within the outer band. Preferably, the magnets in the outer bands have differing strengths, the stronger magnets being disposed closer to the target periphery.

The invention allows increased ionization of the sputtered atoms and provides magnetic guidance of the sputtered ions accelerated towards the substrate being sputtered coated. Thereby, deep hole filling is facilitated, and center-to-edge uniformity is improved.

DETAILED DESCRIPTION OF THE PREFERRED EMBODIMENTS

Figure 1:
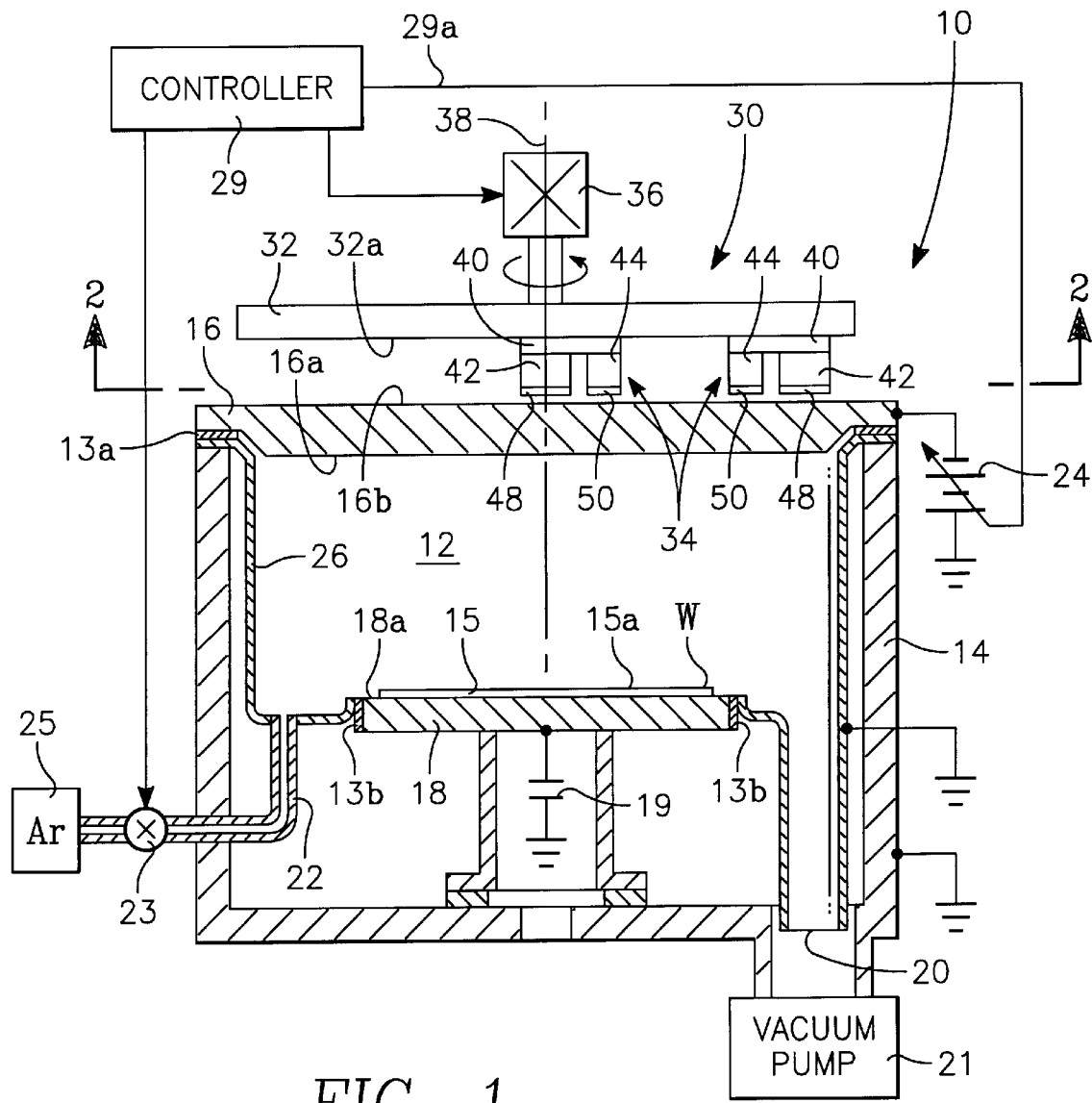
FIG. 1 is a schematic diagram cross-section illustrating the configuration of the magnetron type sputter reactor of the present invention.

In order to realize the aforementioned objects of the invention, the present inventors have performed extensive research. The experiments sought a magnet arrangement which reduces the aforementioned tendency for non-uniform sputtering deposition. In one experiment, magnets were arranged around the central region in order to increase the deposited amount of material in the region adjacent to the central portion that had a greater film thickness. The experimental results showed, however, that the object of increased uniformity could not be met.

Two general results were observed. First, it was found that the bottom coverage at the bottom of connection holes with a high aspect ratio can be improved by reducing the pressure of the processing gas supplied to the sputtering device. Secondly the idea of rotating the magnetron seemed promising. That is, if magnets are arranged radially outward from the center of the substrate and are rotated, the magnets can pass over the entire consumable surface of the target.

However, the experiments showed that if the pressure of the processing gas is reduced, the plasma used for sputtering cannot be maintained. Based on further experiments, it is believed the reason the plasma cannot be maintained is that, if the pressure is reduced, the supply of electrons is also reduced. Also, the electrons in the plasma will escape to any electrically conductive surface and be lost from the plasma.

This decrease in electron density can be avoided by (a) adding a new source of electrons or (b) confining the generated electrons to prevent them from escaping. When gas is supplied to the chamber to replenish the supply of electrons, it is important to prevent the generated electrons from escaping. Therefore, the design of the sputtering device was thoroughly examined for escape paths for electrons. The inventors noticed the fact that the shield arranged in the vacuum chamber is grounded. It is believed that some of the electrons in the plasma flow to the shield because of the potential difference between the plasma and the shield. Consequently, the electron density can be increased if the number of the electrons flowing to the shield is reduced.

In order to reduce the electron current flow to the shield, the inventors feel that they should have a better knowledge of the magnitudes and orientations of the magnetic and electric fields in the vacuum chamber as well as the movement of the electrons in the electromagnetic field.

Generally speaking, in an electromagnetic field, electrons move along a curve in a direction corresponding to the direction of the electric field and rotate about magnetic field lines resulting in a spiral trajectory. The magnetic field generated by the magnetron extends to the outside of the vacuum chamber. As a result, in this magnetic field, some of the electrons that are in the helical movement about the magnetic lines will reach the shield and be grounded from the plasma at that point. The magnetic field is used to increase the density of the plasma but is unable to completely confine the generated electrons.

Consequently, the inventors have concluded that the problem can be solved if a magnetron generates a magnetic field that can confine the electrons.

The sputtering device of the present invention is equipped with a vacuum chamber, a vacuum pump for reducing the pressure of the vacuum chamber, a gas supply means for supplying a sputter work gas to the vacuum chamber, a pedestal for supporting a substrate in the vacuum chamber, a sputtering target, and a magnetron. Advantageously, it also includes a drive motor for rotating the magnetron. In the sputtering device, the consumable surface of the sputtering target faces the substrate pedestal. The magnetron is arranged on the opposite side of the sputtering target from substrate support part.

The magnetron of the invention has first and second magnet bands of opposite magnetic polarities. The second magnet band is arranged outside and surrounding the first magnet band. Preferably, the first and second magnet bands are separated at their poles by a constant gap. The magnetron is unbalanced since the total magnetic flux produced by the first, inner magnet band is less than that of the second magnet band. Since the first magnet band that produces a lower magnetic flux density is arranged on the inside of the second magnet band that produces a higher magnetic flux density, part of the magnetic flux from the second magnet band on the outside reaches the first magnet band on the inside, passes through the interior of the first magnet band without touching it, and terminates in the second magnet band. Consequently, since the magnetic flux that passes outside the vacuum chamber can be reduced, the ability of confining the electrons can be improved.

The first and second magnet bands may have one of the following forms. The magnetron may have multiple first and second magnets. The multiple first magnets are arranged in a band with the first magnetic pole, e.g. N, pointing to the target. The multiple second magnets are arranged in a second band with the second magnetic pole, e.g. S, pointing to the target. The magnetic polarization of the first magnet band is opposite from that of the second magnetic band. If each magnet band is made up of multiple magnets, the shape of the magnetic field generated by each magnet band can be changed in accordance with the positions that the magnets occupy. It is preferred that the stronger, second magnet band comprise the magnets arranged on the outermost periphery. In this way, the electrons in the plasma on the inner side of the second magnet band can be confined.

The magnetron may have magnetic members or yokes arranged in such a way that the first and second magnet bands together form a magnetic circuit. For example, the magnetron may have a magnetic yoke which both supports and magnetically couples the first and second sets of magnets. If a magnetic circuit is formed, part of the magnetic flux of the second magnets will reach the first magnets, pass through the interior of the first magnets and the magnetic yoke, and terminate at the second magnets. Also, the rest of the magnetic flux will extend in such a way to include the first magnets inside the magnetic circuit path, pass through the interior of the first magnets, and be confined by the second magnets. When a magnetic circuit is formed in the magnetron, it is possible to control the magnetic field so that it has the preferred shape for confining the electrons without affecting other magnetic qualities.

In the sputter reactor of the present invention, the multiple second magnets can be arranged in the form of a ring or band to surround the multiple first magnets, which may also be arranged in the form of a ring or band. An aperture free of permanently magnetized material may be formed within the inner-most band although such a magnet-free aperture is not always needed.

In the sputtering device of the present invention, the magnetron may have further third magnetic yokes, better characterized as first and second magnetic pole pieces. Each of the first magnetic pole pieces is arranged at the end of each first magnet to magnetically couple together first magnetic poles. Each of the second magnetic pole pieces is arranged at the end of each second magnet to magnetically couple together the second magnetic poles. Since the first and second magnetic pole pieces are arranged to magnetically couple the adjacent magnets, the magnetic flux can also be guided to the regions between the magnets where no magnet is present. Consequently, the magnetic flux generated by each magnet can be averaged by the magnetic pole pieces and then applied to the sputtering target. The variation (individual difference among magnets) in the magnetic flux density between the adjacent magnets is thereby also averaged.

In the sputtering device of the present invention, the magnetic yokes are arranged in an appropriate manner to support the other ends of each of the first and second magnets. The first magnetic pole pieces are arranged in the form of a ring to connect one end of each of the first magnets. The second magnetic pole pieces are arranged in the form of a ring to connect one end of each of the second magnets.

In the magnetron of the invention, the magnetic flux generated by one end of the first and second magnets is also distributed in the regions between the various magnets with the aid of the first and second magnetic pole pieces. Therefore, the first and second magnets can each form ring-shaped magnetic fields near the consumable surface. Plasma is generated between the two ring-shaped magnetic fields. Consequently, when magnetic fields are generated in such a way as to include the inside magnets within the magnetic flux loop, the ability to confine electrons can be improved. The magnetic flux generated by the other end of the second magnets on the outside passes through the interior of the first magnetic yokes and reaches the other end of the first magnets. Part of the magnetic flux passes through the first magnets, reaches one end of the first magnets, and forms a loop with the magnetic flux generated by one end of the second magnets. The rest of the magnetic flux extends from the magnetic yokes and forms a loop with the magnetic flux generated by one end of the second magnets. If the magnetic field is controlled by the aforementioned magnetic circuit, the magnetic flux can be prevented from expanding to the outside. Consequently, the electron-confining efficiency of the plasma can be improved.

The sputtering device of the present invention may have a sputtering target which contains Ti, Al, and/or Cu, although other materials are possible.

The experiments described above also addressed the uniformity of deposition of target erosion. Based on these experiments the inventors concluded that the magnets used to control the film thickness at the central portion of the substrate and the area surrounding the central portion can be arranged in the region that includes the center of rotation and that the magnets used to control the film thickness at the edge of the substrate can be arranged in the portion corresponding to the periphery of the target, and that the magnets used to control the sputtering quantity of the consumable surface and the thickness of the film formed on the substrate can be arranged between the central region and the edge region.

The sputtering target is positioned so that the consumable surface faces the substrate pedestal. The magnetron is positioned on the opposite side of the target with respect to the pedestal and has a region facing the sputtering target. The drive means uses a shaft that is aligned to a rotation axis passing through a certain point on the consumable surface such as its center and is able to rotate the magnetron with respect to the sputtering target.

The magnetron has the previously described first and second magnet bands which are used to generate a magnetic field in the vacuum chamber. To increase uniformity, the magnet band is arranged in one of the facing regions through which passes the rotation axis.

As described above, the first magnet band is arranged in one of the facing regions in the sputtering reactor. Therefore, the first magnet band can be suitably arranged to specify the magnetic fields to be generated in the central and peripheral regions of the target. Also, the first magnet band can be suitably arranged to control the sputtering rate of the consumable target surface and the amount of the film deposited on the substrate in areas extending from the center to the periphery. Since the conventional restrictions concerning the uniformity of the sputtering distribution on the consumable surface are reduced, a suitable magnetron shape can be adopted for the plan or shape of the first magnet set under different conditions than those imposed by the conventional restrictions of a stationary. Consequently, the shape of the region where the magnetic field is to be formed can be simplified, and the sputtering uniformity of the consumable surface as well as the uniformity of the film thickness can be improved. The spacing between the pedestal and the target is preferably about 0.95 times the diameter of the substrate, that is, 190 mm for a 200 mm wafer.

Also, since the first magnet band can be arranged in one of the separated facing regions, the sputtering uniformity can be guaranteed, and the region near the consumable surface where plasma is formed can be reduced. Since power applied to the target is concentrated in this region of the magnetron, the plasma density can be increased without raising the applied power. When the plasma density is increased, the electron density is also increased. As a result, the ionization fraction of the sputtered particles can be increased. Since the ionized sputtered particles are accelerated toward the surface of the substrate, the number of sputtered particles arriving at the substrate and having a velocity component in the direction of the surface of the substrate can be increased. Consequently, most of the sputtered particles reach the region directly below the plasma region, and a film is preferentially deposited in the region of the substrate that the electrons and ions reach. Therefore, the uniformity of the film thickness and the bottom coverage can be improved.

The present invention may have the following various forms.

In the sputtering device of the present invention to achieve increased uniformity, the first magnet set may have one or more first magnets and one or more second magnets. The first magnets have a first part producing a first magnetic pole and a second part producing the opposite second magnetic pole. It can be arranged with the first part facing the target. The second magnet has a third part exhibiting the first magnetic pole and a fourth part exhibiting the second magnetic pole. It can be arranged with the fourth part facing the target. That is, the first and second magnets are aligned to produce anti-parallel magnetic polarities.

If the first magnet set has one or more magnets with different magnetic poles, a suitable magnetic field shape for achieving the sputtering uniformity of the target and the uniformity of the film thickness on the substrate can be realized that corresponds to the shape or arrangement of the magnets.

As described previously, the first magnet set may have magnetic yokes used for supporting the first and second magnets. The first and second magnets can be magnetically coupled by the magnetic yokes and function as single magnetic body. A magnet assembly can be formed by the first and second magnets as well as the first magnetic yokes.

In the magnetron of the present invention, one or more second magnets can be arranged in the form of a ring outside one or more first magnets. Such an arrangement is preferred for the confinement of the plasma by the magnetic field.

In the magnetron of the present invention, the first magnet band may also have magnetic members better characterized as first and second magnetic pole pieces.

The second parts of the multiple first magnets are magnetically coupled to each other via the first magnetic pole faces arranged between the magnets and the target. Such magnetic coupling can be realized by supporting the first magnetic pole faces on the first magnets. Since the magnetic flux from the second parts passes through the interior of the first magnetic pole faces, the variation in the magnetic characteristics of the various magnets can be averaged, and the magnetic field in the regions between the magnets can be compensated. Similarly, the third parts of the multiple second magnets are magnetically coupled to each other via the second magnetic members arranged between the magnets and the target. Such magnetic coupling can be realized by supporting the second magnetic pole faces on the second magnets. Since the magnetic flux from the third parts passes through the interior of the second magnetic pole faces, the variation in the magnetic characteristics of the various magnets can be averaged, and the magnetic field in the regions between the magnets can be compensated. Since the magnetic field is also guided between the various magnets with the aid of the first and second magnetic pole faces, the confinement of the plasma can be improved.

In the magnetron of the present invention, the first magnet band may additionally have multiple third magnets. Also, the magnetron may have a second magnet band on the inside of the multiple third magnets. The second magnet band may have multiple fourth magnets. Each third magnet has a fifth part exhibiting the first magnetic pole and a sixth part exhibiting the opposed, second magnetic pole. The third magnets are arranged in the form of a ring with the fifth parts pointing to the target. Each fourth magnet has a seventh part exhibiting the first magnetic pole and an eighth part exhibiting the opposed second magnetic pole. The fourth magnets can be arranged with the eighth part pointing to the target. Therefore, the third and fourth magnets are arranged with anti-parallel magnetic polarities.

In the magnetron of the present invention, the first magnet band may have multiple fifth magnets. Also, the magnetron may have a third magnet band arranged outside the multiple fifth magnets. The third magnet part may have multiple sixth magnets. Each fifth magnet has a ninth part exhibiting the first magnetic pole and a tenth part exhibiting the opposed, second magnetic pole. The multiple fifth magnets are arranged with the ninth parts pointing to the target. Each sixth magnet has an eleventh part exhibiting the first magnetic pole and a twelveth part exhibiting the opposed second magnetic pole. The sixth magnets can be arranged in the form of a ring with the eleventh parts pointing to the target.

To achieve increased uniformity, the sputtering device of the present invention is equipped with a magnetron having the following form. The magnetron may have at least one first magnet assembly and multiple second magnet assemblies. The first magnet assembly is suitably arranged to specify the magnetic field to be formed near the rotation center. The multiple second magnet assemblies are positioned in one of the facing regions separated by a plane that includes the rotation shaft and are suitably arranged to form a ring-shaped pattern together with the first magnet assembly.

In the magnetron, since the second magnet assemblies, which are arranged in the form of a ring together with the first magnet assembly, are disposed in one of the facing regions, the magnet assemblies can be arranged in an appropriate pattern to realize the desired film thickness uniformity. Consequently, it is possible to form a suitable magnetic field for increasing the sputtering uniformity of the consumable target surface and for improving the uniformity of film thickness. If the magnet assemblies can be suitably arranged to reduce the region where the plasma is formed, the in-plane film thickness uniformity can be further improved.

In the aspect of the invention for increased bottom coverage, the film-forming method of the present invention has the following steps: (1) providing a sputter reactor which is equipped with a first magnet set arranged with the first magnetic pole pointing to a target made of a prescribed material and a second magnet set arranged outside the aforementioned first magnet set with the second magnetic pole opposite the first magnetic pole pointing to the target, where the magnetic flux density produced by the inner first magnet band is less than that produced by the second outer magnet band; (2) setting a substrate opposite the aforementioned target; (3) supplying a sputter working gas such as argon to the vacuum chamber; (4) and forming a film made of a prescribed material on the substrate by depositing sputtered particles on the substrate.

If the magnetron is prepared as described above, the electrons in the plasma can be efficiently confined to the plasma. Consequently, since the electron density can be increased, the sputtered particles are more completely ionized. The ionized sputtered particles are accelerated by an electric field toward the substrate.

Since the plasma can be maintained even if the pressure of the working gas is reduced, then it is possible to reduce the pressure of the processing gas without adverse effects of extinguishing or destabilizing the plasma. Consequently, the probability that sputtered particles will collide with the atoms of the working gas can be reduced. Thus, the number of sputtered particles traveling undeflected from the target to the substrate can be increased.

In the aspect of the invention for increased uniformity, the film-forming method of the present invention includes the following steps: (1) providing a sputtering device equipped with a magnetron which has magnets arranged in one of the regions separated by a plane that includes the rotation central shaft of the magnetron; (2) setting a substrate opposite the consumable surface of a sputtering target; (3) feeding a sputter working gas to the vacuum chamber; and (4) forming a film by depositing sputtered particles on the substrate while rotating the magnetron.

Magnets are arranged in one of the regions of the magnetron divided by a plane perpendicular to the face of the target that includes the rotation shaft of the magnetron. In this way, a film can be deposited while controlling the sputtering. Since the sputtering uniformity of the consumable target surface can be improved and the region of the magnetic field can be reduced, the plasma region can be reduced. As a result, the electron density can be increased without increasing the input power. Ionization of the sputtered particles is increased by the increased electron density, and the ionized particles are accelerated toward the surface of the substrate. Consequently, most of the sputtered particles reach the region directly below the plasma region.

The detailed embodiments of the present invention will now be explained with reference to the figures. If possible, the same parts will be represented by the same reference numerals, and their repeated explanation will be omitted.

FIG. 1 is a schematic diagram illustrating the configuration of one embodiment of a magnetron sputter reactor of the present invention. The sputtering reactor 10 includes a housing 14 forming a vacuum chamber and including within it a processing space 12. It also includes a target 16 which is suitably arranged to seal the opening at the top of housing 14. Since both the housing 14 and the target 16 are made of an electrically conductive material, an electrically insulating isolator 13a is sandwiched between the housing 14 and the target 16. In the embodiment shown in FIG. 1, the housing 14 has a circular bottom and a cylindrical sidewall which extends from the periphery of the circular bottom to a prescribed height. For example, the tubular part is shaped like a cylindrical shell. The target 16 is shaped like a disk. One circular surface 16a (referred to as the bottom) of the target 16 is used as the consumable surface which is consumed by sputtering material from the target.

A pedestal 18 is arranged in the processing space 12 within the housing 14 of the vacuum chamber. As a substrate support means (also called a substrate support part), the pedestal 18 is used to support a substrate 15 in the processing space 12. Consequently, the pedestal 18 supports the substrate 15 to be processed, such as a semiconductor wafer W or a glass substrate. The top 18a of the pedestal 18 is set to face the bottom, consumable surface 16a of the target 16. The top, deposition surface 15a of the substrate 15 (wafer W) is held at a prescribed position on the pedestal 18 essentially in parallel to the bottom 16a of the target 16. The substrate 15 is arranged coaxially so that its center is aligned with the center of target 16. In order to improve the in-plane uniformity of the sputter deposited film, it is preferred that the center of the substrate coincides with the rotation center of the shaft 38 of the magnetron. In the present embodiment, the dimensions of the target 16 and the distance between the pedestal 18 and the target 16 can be the same as those of a conventional standard sputtering reactor. The spacing between the pedestal 18 and the target 16 should preferably be about 0.95 times the diameter of the substrate on which sputtered particles are to be coated, that is, about 190 mm for a 200 mm wafer. This spacing corresponds to short throw sputtering. Longer spacings are sometimes used to collimate sputter particles, particularly neutrals.

In order to prevent the sputtered particles from reaching the inner wall surfaces of the vacuum chamber housing 14, the sputter reactor 10 includes a shield 26 to block the sputtered particles from reaching the inner wall surface. The upper end of the outer side of the shield 26 is sandwiched between the housing 14 and isolator 13a and is fixed at and electrically grounded to the edge of the opening on the top of the housing 14. The inner side of the shield 26 reaches the side surface of the pedestal 18. The edge portion of the inner side is fixed through an insulating part 13b along the side surface of pedestal 18. Consequently, the shield 26 is electrically insulated from the pedestal 18. The pedestal 18 is connected to a reference potential, such as ground potential, through an isolation capacitor 19, which allows the pedestal 18 to be used in a self-biased state having a self-bias voltage depending on the electrons supplied by the plasma. It can also be used in an RF-biased state by applying a high frequency via the isolation capacitor 19. In this case, a bias means known as RF-bias-application means, such as an RF power supply, is set between the capacitor 19 and the reference potential. In either case, it is preferred that the pedestal 18 be negatively biased with respect to the plasma potential and be at a negative potential with respect to the grounded shield 26.

An exhaust port 20 is formed in the housing 14. In the present embodiment, a cryopump or other vacuum pump 21 is connected to the exhaust port 20, and the vacuum pump 21 is used to reduce the pressure of the vacuum chamber 12. The exhaust port 20 and vacuum pump 21 constitute a decompression means. A processing gas such as argon as the sputter working gas or nitrogen as a reactive gas is fed into the vacuum chamber 12 from a gas supply source 25 through a supply port 22. The flow of gas through the supply port 22 can be metered with a mass flow controller 23. By opening or closing the mass flow controller 23, it is possible to control the supply of the processing gas in terms of quantity and supply frequency. The supply port 22 and the gas supply source 25 constitute the processing gas supply means.

The cathode and anode of a target power supply 24 are connected as a plasma forming means between the target 16 and the shield 26. When the argon working gas is supplied to the vacuum chamber 12 and a negative voltage is applied between the target 16 and the shield 26, a glow discharge occurs and the argon gas is excited to form a plasma. When the positive argon ions generated by the discharge collide with the bottom 16a of the negatively charged target 16, the target atoms are ejected as sputtered particles. When the target atoms are deposited on wafer W, a film is formed on the wafer.

A magnetron 30 is arranged on the surface of the target 16 opposite its bottom 16a, that is, above the top 16b of the target 16 outside the processing space 12. The magnetron 30 generates a magnetic field adjacent the bottom surfaces 16a of the target 16 and thus increases the plasma density near the consumable surface 16a of the target 16.

The sputtering reactor 10 may include a controller 29 made up of microcomputers, timers, etc. that turn the current on and off and adjust the target current value and control the argon supply as well as other functions. The controller 29 is connected to the mass flow controller 23, the target power supply 24 and the drive motor 36 via control lines 29a. The controller 29 is able to control and interconnect these various devices. Consequently, the supply of processing gas, generation of the plasma with the processing gas, etc. can be controlled with the desired timing.

Figure 2:
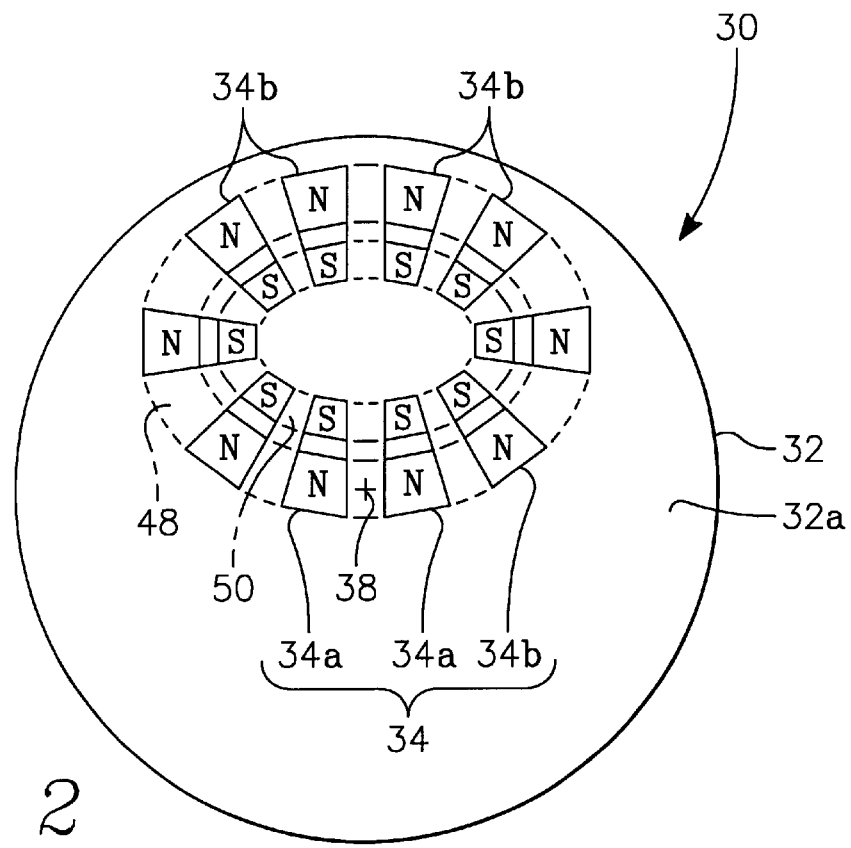
FIG. 2 is a plan view illustrating the arrangement position of the magnet pairs.

FIG. 2 is a bottom plan view taken along a cross section along line 2—2 in FIG. 1 illustrating the position of each magnet of the magnetron. As shown in FIGS. 1 and 2, the magnetron 30 has a circular base plate 32, which is preferably non-magnetic, and multiple magnet assemblies 34 (alternately numbered as 34a or 34b depending on distinctions to be made later) fixed in a prescribed pattern on a bottom loading surface 32a of the base plate 32. The base plate 32 is arranged on the opposite side of the target 16 with respect to the pedestal 18. A rotary shaft 38 of the drive motor 36 is connected to the center of the top of the base plate 32. Consequently, when the drive motor 36 is operated to rotate the base plate 32, each magnet assembly 34 rotates along the top of the target 16. In this way, it is possible to rotate the magnetic field generated by the magnet assembly 34 about the target 16, and the erosion of the target 16 is made more uniform.

The magnet assemblies 34 are typically formed of a pair of magnets of opposed polarities, and the terminology of magnet pairs will hereafter be used even though a more general concept is retained. For example, a horseshoe magnet is equivalent to a magnet pair including their yoke. As shown in FIG. 2, multiple magnet pairs 34 are arranged in the form of a ring. Each magnet pair 34 is suitably arranged with one magnetic pole (North or N pole in the example shown in FIG. 2) disposed on the outside of the ring and the other magnetic pole (South or S pole) on the inside. The end portions of the same magnetic poles of the magnet pairs 34 are respectively magnetically coupled through circumferentially extending magnetic members 48 and 50 known as pole pieces. The pole pieces 48 and 50 (in FIG. 2, represented by broken lines because they overlap the magnets) are band-shaped members which are arranged in the form of a ring to connect the end portions of the various magnet pairs of the same magnetic polarity. An outside ring-shaped region and similarly shaped inside region are formed on the consumable target surface corresponding to the magnetic fields generated from the band-shaped pole pieces. In the outside ring-shaped region, for example, the lines of magnetic force generated by the magnet group (N poles of the magnet assemblies 34) on the outermost periphery extend into the vacuum chamber. Some of the lines of magnetic force point to the inside and pass through the interior ring-shaped magnetic field region and reach the magnet group on the inside (S poles of the magnet pairs 34).

The magnetic pole pieces 48 and 50 are arranged between the magnet pairs 34 and the sputtering target 16 to magnetically couple the two sets of respectively matched adjacent poles. As a result, the magnetic flux is also guided into the regions between the various magnets without magnets being present in the region. The magnetic flux generated by each magnet can be averaged by the magnetic pole pieces and then applied to the sputtering target. Even if the magnets are arranged in a discrete and separated manner, a continuous magnetic field with a prescribed intensity can be formed with the aid of the magnetic pole pieces 48 and 50. Consequently, the confinement ability of the plasma dependent on the magnetic field can be improved. Also, the variation (individual difference among the magnets) in the magnetic flux density between adjacent magnets can also be averaged. This factor also contributes to confinement of the electrons.

The magnet pairs 34 of the magnetron 30 may be distinguished between one or more first magnet pairs 34a and one or more second magnet pairs 34b. Define an inside half-plane and an outside half-plane at the bottom surface 32a of the base plate 32 which are separated by a vertical plane perpendicular to the base plate 32 and containing the rotation axis 38. The vertical plane is oriented in such a way as to maximize the inclusion of the magnetron in the inside half-space and minimize its inclusion in the outside half-space. The first magnet pairs 34a are used to generate the magnetic field near the rotation axis 38. Consequently, as will be explained below with reference to FIGS. 4–7, the magnet assemblies 34 can be arranged in one of the following ways: (i) the first magnet pairs 34a can be arranged in one of the half-spaces on the magnetron, but preferably only partially in the outer half-space; (ii) the first magnet pairs 34a can be suitably arranged to cross the line of the plane and thus to occupy both the half-spaces; and (iii) the outside magnets of the first magnet pairs 34a are arranged in the other region on the magnetron separated by the plane that includes rotary shaft 38. In each case, the second magnet pairs 34b, located within the inner half-space are suitably arranged to form a ring-shaped pattern together with the first magnet pairs 34a. Experiments performed by the inventors determined that particularly favorable results could be obtained with the arrangements shown in FIGS. 4, 6, and 7.

Alternatively expressed, the magnetron 30 includes an outer ring-shaped magnet band arranged with the first magnetic pole (N pole in the example shown in FIG. 2) pointing to the consumable target surface and a ring-shaped, enclosed inner magnet band arranged with the second opposed magnetic pole (S pole in the example shown in FIG. 2) pointing to the consumable surface. Preferably, the inner magnet band encloses an aperture of permanently magnetized material so the excess unbalanced magnetic field can flow through the aperture to reach the back of the weaker inner magnet band. The inner magnet band may include all of the magnets arranged inside and enclosed by the outer magnet band. The outer magnet band, for example, may comprise the magnet group on the outermost periphery, while the inner magnet band, for example, can comprise the magnet group inside the magnets on the outermost periphery. The intensity of each magnet band or magnet can be specified in such a way that the total magnetic flux (flux density integrated over the band surface) of the outer magnet band is greater than that of the inner magnet part.

The inner magnet band is designed to produce a total lower magnetic flux (magnetic flux density integrated over the area of the band) and is arranged inside the outer magnet band that produces a higher total magnetic flux. As a result, some of the lines of magnetic flux of the outer magnet band pass over the inner magnet band, pass through the radial interior of the inner magnet band to the magnetic yoke, and are terminate in the outer magnet band. The remaining lines of the magnetic flux of the outer magnet band form a magnetic flux loop including the inner magnet band that is confined in the peripheral magnet band. Consequently, since the lines of magnetic flux that extend radially beyond the vacuum chamber can be reduced, the ability of confining the electrons can be improved.

Figure 3:
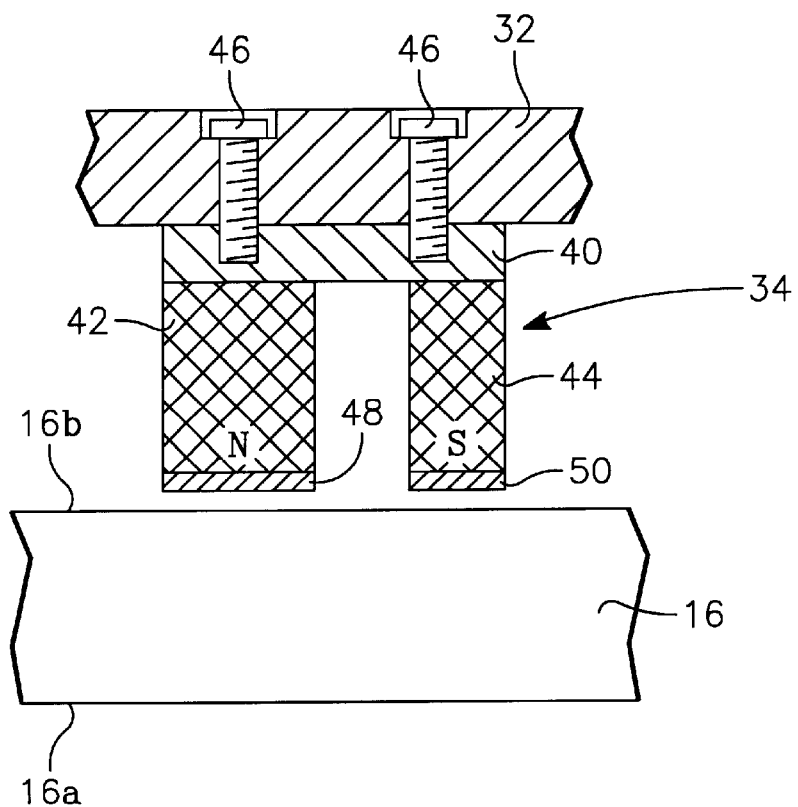
FIG. 3 is an enlarged cross-sectional view of a magnet pair sub-units.

FIG. 3 is a cross-sectional view illustrating an example of a magnet pair 34 that can be used in the sputter reactor 10 of FIG. 1. As shown in FIG. 3, each magnet pair 34 has a magnetic yoke 40 and cylindrical rod magnets 42 and 44. The yoke 40 is a plate-shaped member made of a prescribed magnetic material, for example a ferromagnetic material. The rod magnets 42 and 44 have their S poles at one end and their N poles at the other end. The outer rod magnet 42 is arranged with the N-pole end pointed at target 16, while the inner rod magnet 44 is arranged with the S-pole end pointed at the target. Of course, these magnetic polarities can be reversed. Rectangularly or otherwise shaped magnets may be substituted for the rod magnets 42, 44. The S-pole end of the rod magnet 42 contacts the magnetic yoke 40 and is fixed at one end of the magnetic yoke 40. The N-pole end of the opposed rod magnet 44 also contacts the magnetic yoke 40 and is fixed at the other end of it. The two rod magnets 42 and 44 have respective magnetic polarizations pointing in anti-parallel directions. The overall form of the magnet pair 34 resembles an inverted U. The free end of the rod magnet 42 is the N-pole end, while the free end of the other rod magnet 44 is the S-pole end. Also, since the magnets 42 and 44 and the magnetic yoke 40 form a magnetic circuit, they constitute a magnetic means which can function as an integral magnetic body with different magnetic poles pointing in the same direction. In this way, a magnetic field is formed in the vacuum chamber to advantageously control confine the electrons 12.

In the magnet pair 34, a first magnetic pole piece 48 is set at the free end N pole of each magnet 42 included in the outer magnet band, while a similar second magnetic pole piece 50 is set at the free end S pole of each opposed magnet 44 included in the inner magnet band. As explained above, the magnetic pole pieces 48 are used to couple magnets 42 of one polarity in the magnetron, while the other magnetic pole pieces 50 are used to couple magnets 44 of the other polarity.

In the embodiment shown in FIGS. 2 and 3, each magnet band has multiple magnets. However, either or both of the outer and inner magnet bands maybe formed of only one respective magnet. In this case, the total magnetic flux of the peripheral magnet band (magnet 42) is greater than that of the inner magnet band (magnet 44).

However, the form of the magnet pair 34 is not limited to the example shown in FIG. 3. The magnet pair 34, now more properly called an assembly, may have even more magnets and magnetic members coupling or supporting the magnets. Also, the magnetic flux density of the magnet used in each magnet assembly 34 is determined relative to the magnetic field to be supplied at the arrangement position of magnet pair 34. Consequently, the strength of the magnets can be different.

In the magnet assembly 34 shown in FIG. 3, the free ends of the magnets 42, 44 are suitably arranged to face the top of the target surface 16b which is opposite to the consumable target surface 16a. The magnet pair 34 is fixed on the base plate 32 by an appropriate fixing means, such as screws 46, with the back side of the yoke 40 in contact with the base plate 32. In this way, the fixed position of the magnet assembly 34 on the base plate 32 can be changed as desired by reboring the base plate 32 and milling new pole pieces. Consequently, the shape of the magnetic field can be easily adjusted by the rearranging the positions of the magnet assemblies 34.

Figures 4, 5:
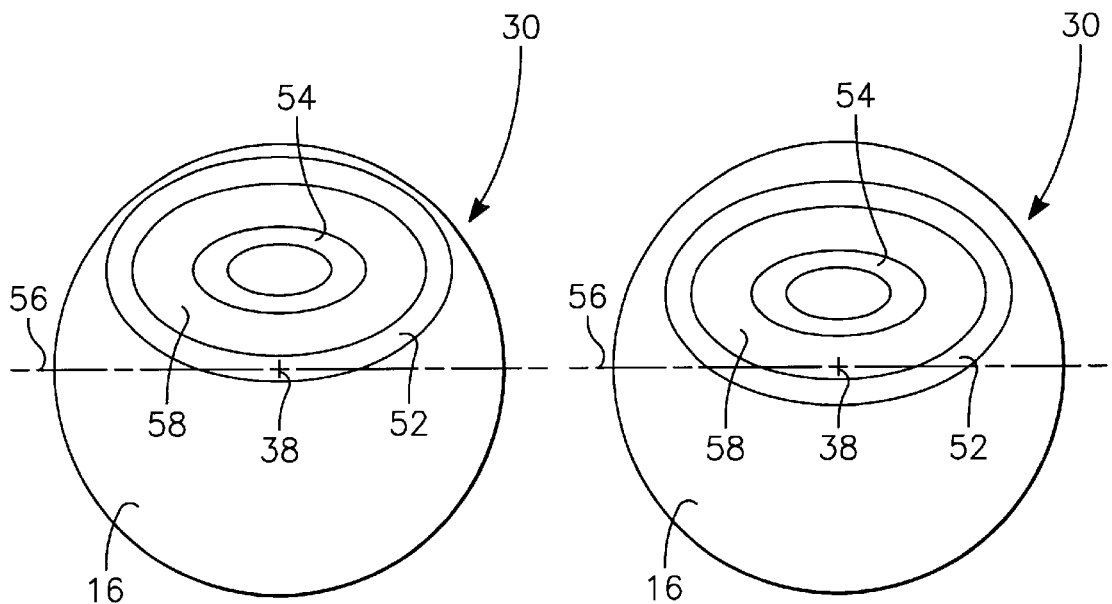
FIGS. 4, 5 and 6 are plan views illustrating three arrangements of closely related magnets for explaining the magnetic field generated by the magnets.
Figures 6, 7:
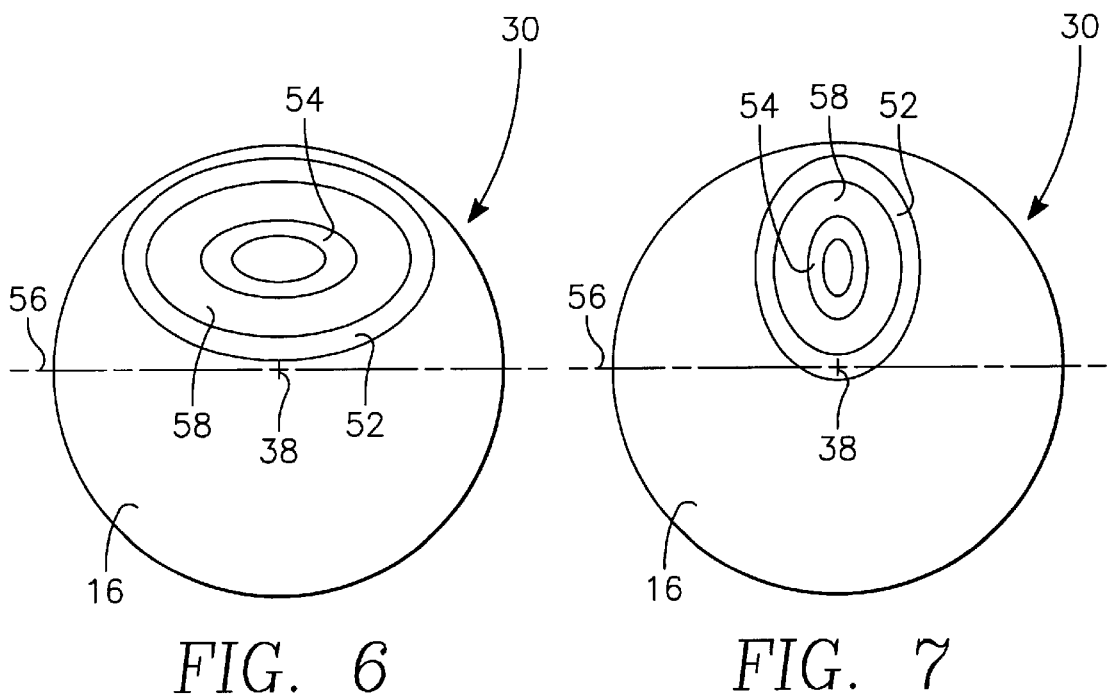
FIG. 7 is a plan view illustrating an alternative arrangement of magnets for explaining the magnetic field generated by the magnets.

FIGS. 4–7 are diagrams illustrating a preferred arrangement of the magnet pairs in sputtering device 10, in which the magnet arrangements of FIGS. 4, 6, and 7 are preferred. In each diagram, an outer magnet band 52 and an inner magnet band 54 are used in order to show the individual arrangement position of the multiple magnet pairs. These figures show the regions where the first magnetic pole pieces 48 associated with the magnet band 52 and the second magnetic pole pieces 50 associated with the inner magnet band 54 respectively project on the consumable target surface. Since the magnetron 30 is rotating 35 about the central axis 38, the illustrated region shows the relative positional relationship between the magnet bands 52, 54 and the target 16 at a certain point in time.

As shown in FIGS. 4, 6, and 7, the inner magnet band 54 is arranged in one of the regions on magnetron 30 separated by the plane perpendicular to the target 16 and including the rotary shaft 38 (in the examples shown in FIGS. 4–7, the upper half of the regions separated by dashed line 56). This plane is the one extending in the direction along which the magnetron shape is symmetric. Alternatively stated, the plane is the one across which the magnetron is least symmetric. The outer magnet band 52 is arranged to surround the inner magnet band 54.

In order to provide magnetic field near the center of rotation, the outer magnet band 52 is arranged to pass through or near the center of rotation 38. Thus, in the examples shown in FIGS. 4 and 7, the position of the outer magnet band 52 overlies the center of rotation 38. In the embodiment shown in FIG. 6, both the outer magnet band 52 and the inner magnet band 54 are located within a single half-space separated by the plane 56. In this case as well, the outer magnet band 52 is positioned so as to produce a desired magnetic field at a position on the target erosion surface coincident with the center of rotation 38. In FIG. 5, the outer magnet band 52 is positioned to surround the center of rotation 38, that is, within the aperture inside of the outer magnet band 52. Additionally, the embodiment of FIG. 6 produces better results than that of FIG. 5.

In order to generate a magnetic field near the rotation center 38, the outer magnet band 52 is suitably arranged to pass through the rotation axis 38 or its vicinity. Therefore, in the arrangements shown in FIGS. 4–7, the outer magnet band 52 overlaps the rotation axis 38. In the arrangement shown in FIG. 5, the position of the outer magnet band 52 is set to include on its interior the rotation axis 38. In this case, the peripheral magnet band 52 is suitably arranged to generate the desired magnetic field at a position on the consumable surface corresponding to rotation axis 38. The arrangement of FIG. 5 is not the most preferred one. In the arrangement example shown in FIG. 6, both the outer magnet band 52 and the inner magnet band 54 are arranged in one of the regions separated by dashed line 56. In this case, the outer magnet band 52 is arranged to generate the desired magnetic field at a position on the consumable surface corresponding to rotation center 38. In either case, the magnetic field generated near rotary shaft 38 significantly contributes to the generation of the plasma and confinement of the electrons.

In any of the embodiments of FIGS. 4 through 7, the outer magnet band 52 either passes over the rotation center 38 or is separated from the rotation center 38 by a small distance equal to no more than 10% of the usable radius of the target 16, that is, of its consumable surface 16a. Also, in the interest of a small magnetron and high target power density, the portion of the outer magnet band 58 closest to the rotation center 38 passes no further than 15% of the usable target radius from the rotation center 38 on the side away from the major portion of the magnetron 30. Alternatively stated, the outer magnet band 52 (and thus the entire magnetron 30) principally lie in a half, semi-circular area of the target 16 having a boundary with the second half, semi-circular are along the dashed line 56. The outer magnet band 52 extends into the second half-space by no more than 15% of the target radius.

For the outer magnet band 52 and the inner magnet band 54 shown in FIGS. 4 and 6, the width of the profile in the direction along axis 56 is longer than the length of the profile in the direction perpendicular to axis 56. That is, for a magnetron shape extending generally along a radial direction from the rotation axis 38 to the periphery of the target 10, the shape follows an oval having a minor axis along the radial direction and a transverse major axis. On the other hand, for the outer magnet band 52 and inner magnet band 54 shown in FIG. 7, the width of the profile in the direction along the axis 56 is shorter than the length of the profile in the direction perpendicular to axis 56. That is, the oval magnetron shape has a major axis along the radial direction and a transverse minor axis. The positional relationship between magnet band 52 and the rotary shaft 38 shown in FIG. 7 can be applied in the same way to the illustrated magnet bands.

It has been found that the magnet arrangements of FIGS. 4, 6, and 7 provide superior results over the arrangement of FIG. 5. That is, either the rotation axis 38 should be included on the outside of the outer magnet band 52 or the outer magnet band should pass over the rotation axis 38. In the latter case, preferably the outer magnet band 52 should not pass through a region of the half-space not containing most of the magnetron by a distance of more than 10% of the target radius from the rotation axis 38 at the center of the target.

In FIGS. 4–7, the magnetic fields generated by the outer magnet band 52 and the inner magnet band 54 are realized using at least one first magnet pairs (34a in FIG. 2), which can form a magnetic field in the region including the rotation center 38, and multiple second magnet pairs (34b in FIG. 2) which are arranged in the form of a ring to generate a magnetic field in a region away from the rotation axis 38. The second magnet pairs 34b are arranged in one of the regions on the magnetron 30 separated by the plane that includes the central shaft 38. Since the magnetron 30 is able to supply a magnetic field to the areas slightly outside of the magnet bands 52 and 54 in addition to the outer and inner magnet bands 52, 54, and the region 58 between them, the plasma can be confined to these regions.

The magnetrons 30 illustrated in FIGS. 4 through 7 have generally oval shapes. However, the banded magnetron included within the invention may be implemented with a circular shape, principally confined to one side of the rotation center 38 and rotating about it. Also, many of the advantages of the invention may be enjoyed with banded magnetrons having shapes of a triangle, an arced triangle, or a racetrack. Such shapes and other acceptable shapes have been described by Fu in U.S. patent application Ser. No. 09/249,468, filed Feb. 12, 1999, now U.S. Pat. No. 6,290,825 Fu et al. in U.S. patent application Ser. No. 09/546,798, filed Apr. 11, 2000, now U.S. Pat. No. 6,306,265 and by Chiang et al. in U.S. patent application Ser. No. 09/414,614, filed Oct. 8, 1999. All these patents are incorporated herein by reference in their entireties. In the triangular and arced triangular magnetron, the apex of the triangle lies on or close to the rotation center and the opposed, possibly arced, side lies close to the periphery of the target 16. The racetrack magnetron includes two parallel sides relatively close to each other and running generally radially from near the rotation center 38 to near the periphery of the target 16. The parallel portions are joined by half-circular portions near the center and periphery of the target 16. In the banded magnetron, unlike those described in the cited patents, the inner pole is implemented as a magnet band having an enclosed aperture free of permanently magnetized material.

Since the magnetron 30 rotates around the shaft 38 with respect to the center of the sputtering target 16, the plasma region is able to pass almost uniformly over the consumable target surface 16a even if the magnet pairs 34 are arranged as shown in FIGS. 4–7. Consequently, the sputtering uniformity on the consumable surface is increased even if the magnetic field forming region has a small and simple shape. Also, if the total magnetic flux of the outer magnet band is selected to be greater than that of the inner magnet band, the ability to confine the plasma can be improved. Consequently, the plasma can be maintained even if the pressure of the processing gas is reduced.

However, the possibility is not exluded that the two magnetic flux densities are almost equal or have an opposite inequality relationship to the aforementioned setting.

The electron density of the plasma is also increased when the plasma is better confined. When the density of the confined electrons is increased, the ionization fraction of the sputtered particles is increased. Because the ionized sputtered particles are attracted in the direction of the substrate pedestal 18 following the potential gradient across the plasma sheath adjacent the pedestal 18, the velocity component in this direction is increased. Consequently, the uniformity of film thickness and the bottom coverage can be improved.

Also, since the magnets are arranged in about half of the region of the magnetron which in turn is less than half of the usable target area, the high-density plasma forming region can be reduced by adjusting the arrangement of the magnets, positions. Since the target power is effectively concentrated in the smaller region, the plasma density can be increased without increasing the total target power. Since the electron density is increased when the plasma density is increased, ionization of the sputtered particles is increased. Since the ionized sputtered particles are accelerated toward the surface of the substrate, the number of sputtered particles having their velocity component toward the substrate surface is increased. Consequently, most of the sputtered particles can reach the region directly below the plasma region to form a film in that region. Therefore, the uniformity of the film thickness can be improved.

As shown in FIGS. 4, 6, and 7, the outer magnet band 52 is arranged on the periphery of an oval shape that constitutes a prescribed convex pattern. A convex pattern is a pattern such that a line segment that connects any two points on a closed line in a plane lies always on one side of the line or directly on the line. The pattern may comprise a curve and possibly a straight line. In particular, a pattern comprising a closed curve is known as a convex curve. In a convex pattern, the straight line is tangent to the curve at the connection point of the curve and the straight line that constitute the pattern. In the present invention, the straight line and the curve are connected to each other smoothly. The shape of the magnetic field which confines the plasma in the configuration of FIGS. 4–7 or in triangular or racetrack magetrons is specified as convex. The isomagnetic plane is a plane having the same magnetic magnitude, and the isomagnetic line is the intersection between the isomagnetic plane and a plane parallel to the consumable surface. As a result of the convex magnetic field, changes in the isomagnetic plane can be prevented. Consequently, the electrons in the plasma can be prevented from leaking away.

By adjusting the shape of the isomagnetic plane (line) to promote electron confinement, the electron density of the plasma can be increased. As a result, ionization of the sputtered particles can be increased. Since the ionized sputtered particles are accelerated toward the substrate, the velocity component in that direction is thereby increased. Also, if the pressure of the processing gas is reduced, the probability that the sputtered particles will collide with the atoms of the processing gas can be reduced. In this way, the number of sputtered particles with a velocity component in the direction perpendicular to the substrate can be increased. Consequently, the bottom coverage can be improved by increasing the electron density.

Also, the outer magnet band 52 shown in FIGS. 4–7 is arranged along a prescribed closed curve. According to the present invention, for the illustrated oval magnetrons 30, the minimum radius of curvature of the closed curve is preferred to be at least 0.8 times the maximum radius of curvature, and the minimum radius of curvature of the convex curve is preferred to be at least 0.8 times the maximum radius of curvature. The preference includes the range between the radially flattened oval of FIGS. 4, 5, and 6 and the tangentially flattened oval of FIG. 7, including a circular shape.

These ratios apply o also to the ratios of the minor axis to the major axis of a generally oval shape. A circle is especially desirable due to its high symmetry and large minimum curvature.

In order to reduce the electron current flowing to the shield, studies were conducted examining the movement of electrons in an electromagnetic field. As a result, it was found that electrons cannot be well confined if the contours of the confining magnetic field varies significantly even if the magnitude of the magnetic field does not vary significantly. The motion of electrons in an electromagnetic field is determined by a force in the direction of the electric field and a force related to the speed of the electrons and the direction of the magnetic field. Electrons move along a curve along an electric o field and around a magnetic field line. As a result, for example, when the magnetic field varies significantly, the magnetron might not be able to generate a magnetic field of sufficiently intensity in the region where the electrons reach after their paths curve around the magnetic field. The magnetic field of a magnetron with excessive curvature may be unable to effectively confine the electrons that reach the aforementioned region, and the direction of movement of these electrons cannot be changed. As a result, the electrons are attracted by the electric field and flow into the field.

For the magnetron 30 shown in FIGS. 4–7, it is clear that the magnets used for generating the magnetic field should be suitably arranged in consideration of the speed of the electrons (movement direction and velocity of the electrons), and a configuration that does not significantly change the contours of the magnetic field generated by the magnetron is realized.

Figure 8:
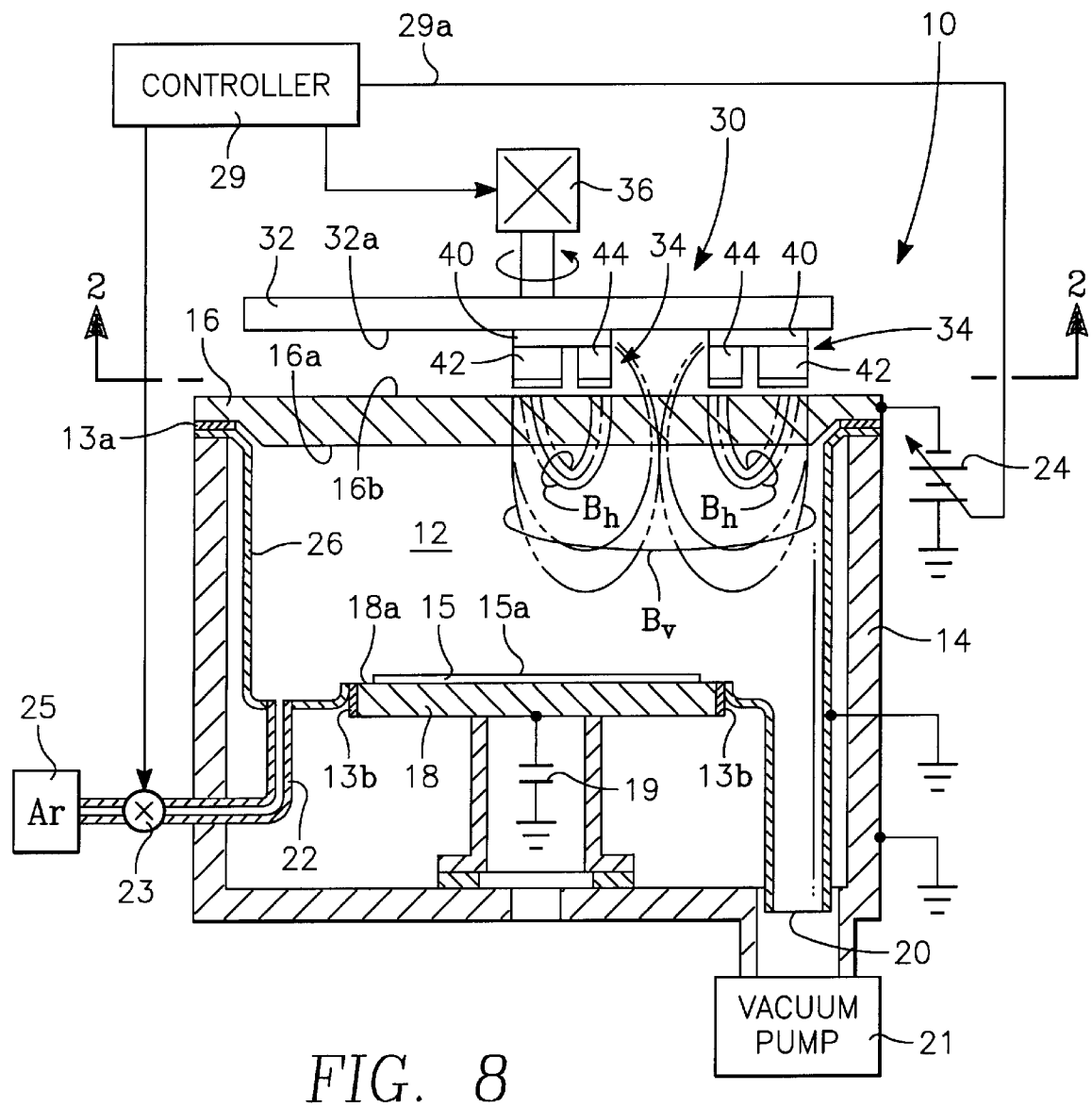
FIG. 8 is a schematic cross-section diagram illustrating a magnetic field formed in the sputter reactor of FIG. 1.
Figure 9:
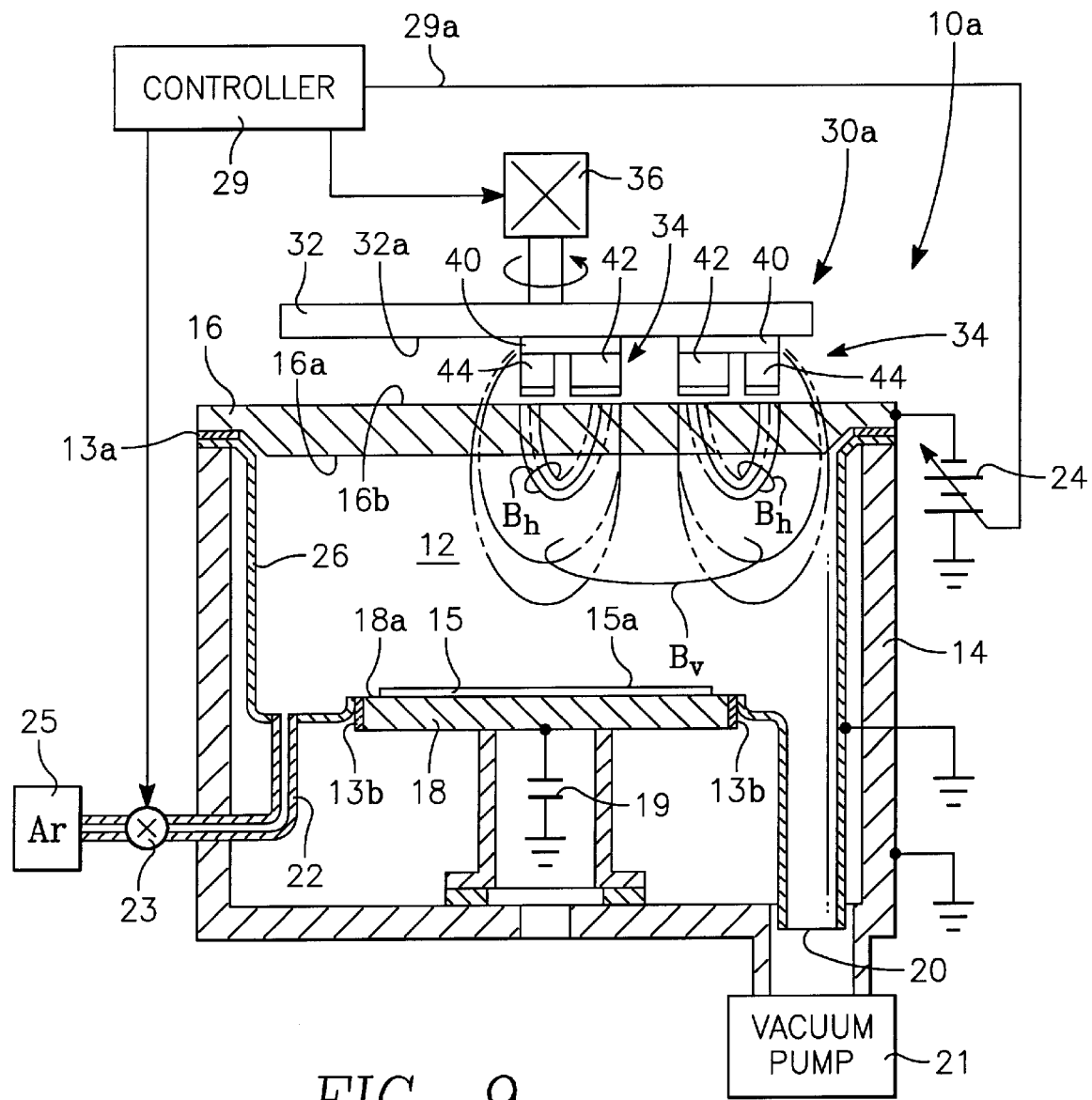
FIGS. 9 and 10 are diagrams illustrating magnetic fields formed in sputter reactors having different magnetrons than that of FIG. 1.

FIG. 8 is a schematic diagram illustrating the magnetic field generated when magnet assemblies 34 shown in FIGS. 2 and 3 arranged to form opposed magnet bands are used in the sputter reactor 10. FIG. 9 is a related schematic diagram illustrating the magnetic field generated in a sputter reactor 10a when the magnet assemblies 34 are arranged with different orientations exchanging the inner and outer magnet bands so that the inner magnet band has the higher magnetic strength. In FIGS. 8 and 9, the magnetic field generated by each magnet assembly 34 of magnetron 30 is represented by broken lines. The magnetic field generated by each sub-unit has one component (parallel component $B_h$) parallel to the consumable target surface 16a near the surface 16a and another component (vertical component $B_V$) in the direction of the axis (reference axis) 18 that points from the target 16 toward the substrate pedestal 18 in the space below the target 16.

In the sputtering device shown in FIG. 8, the lines of magnetic force generated from poles of the strong outer magnets 42 of one polarity included in the outer magnet band (band 52 in FIGS. 4–7) extend toward the inside of the magnetron 30, pass through the interior of the magnetic band-shaped yoke 40 that form the magnetic circuit, and reach the poles of the opposed polarity of the outer magnets 42 through the yoke 40. The lines of magnetic force are closed to enclose the weaker inner magnets 44. Therefore, the magnetic fields generated from the outer magnets 42 point to the interior of the magnetron As a result, the trajectories of the electrons point to the interior of the magnetron 30 corresponding to the curvature of the magnetic fields. Consequently, the electron current flowing radially outward to the grounded shield 26 can be reduced.

In a sputter reactor 10a shown in FIG. 9, the magnetic strengths of the inner and outer magnet bands 52, 54 are adjusted such that, even though the inner magnet band 54 of FIGS. 4–7 is stronger, the magnetic fields generated by the inner magnet band 54 point to the outside of the magnetron 30 but are closed and do not pass through the grounded shield 26.

Figure 10:
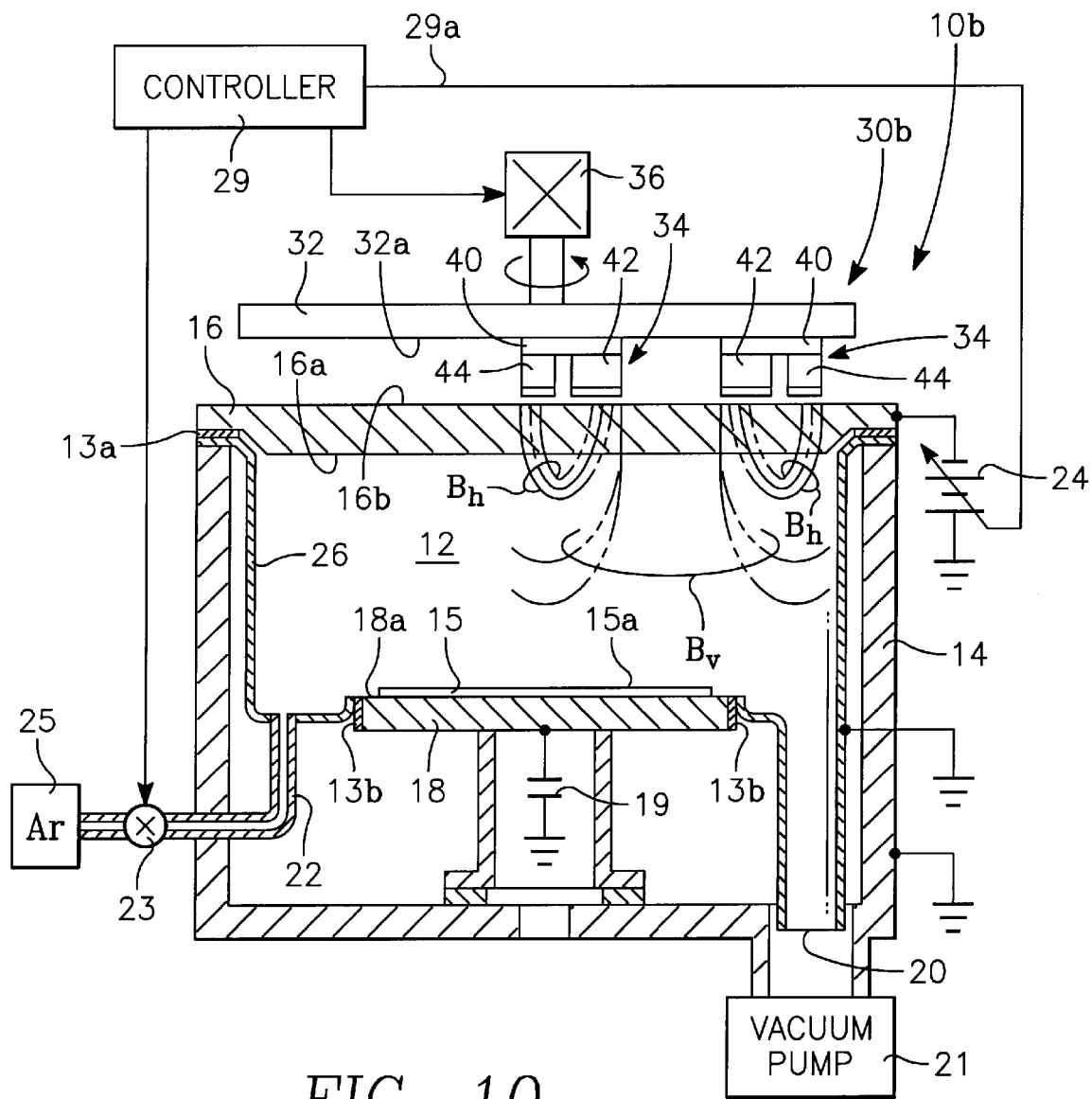

On the other hand, in a sputter reactor 10b shown in FIG. 10, the magnetic fields generated by the stronger inner magnet band (band 54) of FIGS. 4–7), but readjusted in relative strength to the weaker outer band 52, are not closed, and they point to the outside of the magnetron 30, and they intercept the grounded shield 26. Such magnetic fields less effectively confine the plasma, since they leak electrons to the shield 26.

Both of the magnetrons 30, 30a shown in FIGS. 8 and 9 can be used in the sputter reactor of the present invention. However, the magnetron which has a stronger outer magnet band and generates the magnetic field shown in FIG. 8 is more suitable for increasing the electron density of the plasma.

As explained above, the magnetron 30 is arranged in the form of a closed ring, and also both the opposed north and south poles are arranged in the form of respective rings with and included region free of magnetic material. However, it is also possible to form the magnetron in the form of multiple rings. In either case, a magnetic field is confined, and the electron density can be increased by the effect of the magnetic field.

Figure 11:
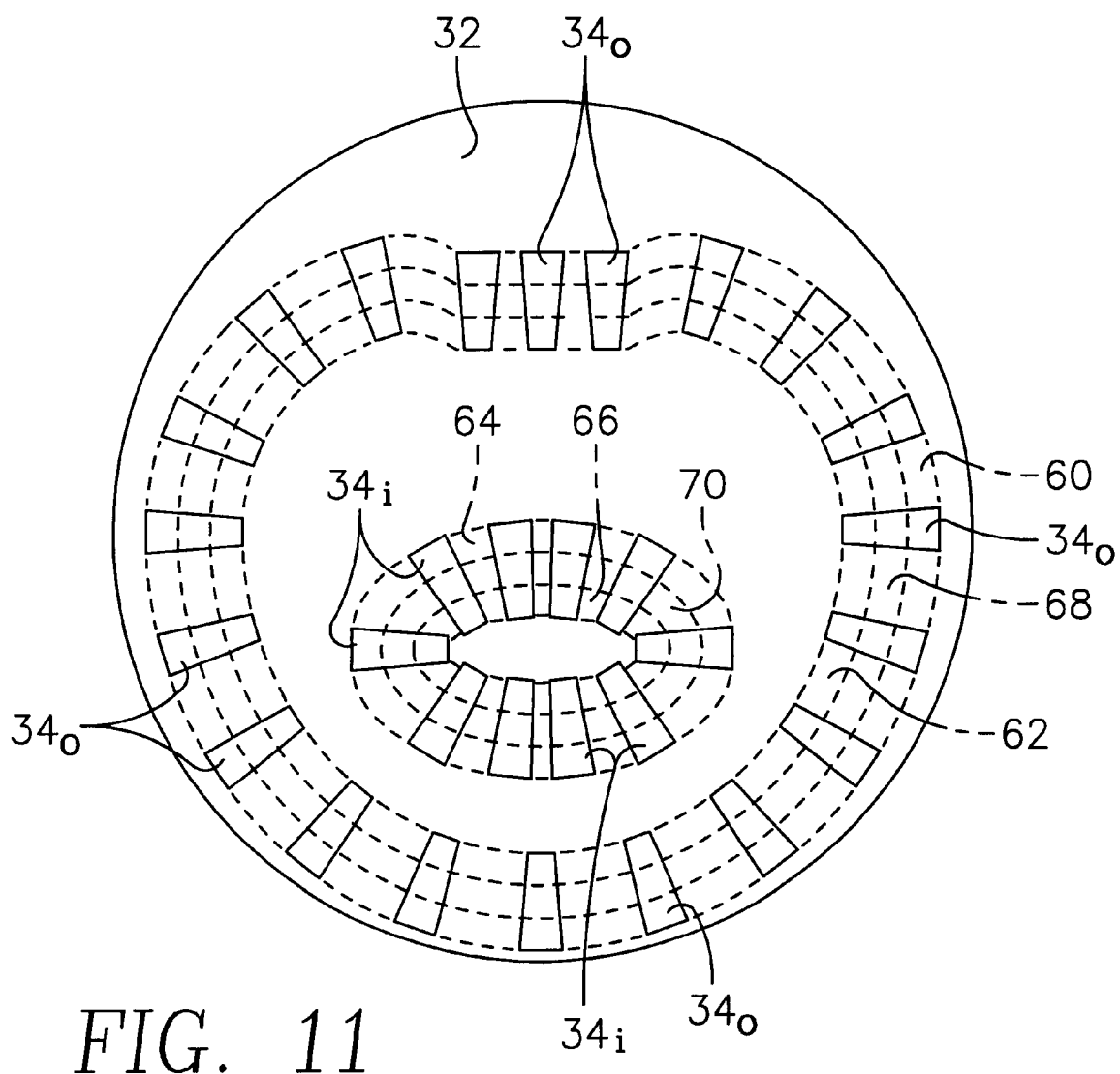
FIG. 11 is a plan view of magnetron including nested magnet bands.

Also, in the explanation made for the sputter reactor 10 of the present invention, the arrangement of the magnetic bands is principally limited to the half-region of the magnetron 30. The present invention, however, is not limited to this arrangement. FIG. 11 is a plan view, along a cross section corresponding to cross section line 2—2 in FIG. 1 illustrating a different arrangement of magnet pairs 34. Various types of arrangement of magnet pairs 34 have been considered. In the present embodiment, as shown in FIG. 11, the magnet pairs 34 can also be arranged in the form of a double ring. The magnet pairs include inner ring-shaped magnet pairs 34$_o$ arranged to form ring-shaped bands 64 and 66 and outer magnet pairs 34$_o$ arranged to form ring-shaped bands 60 and 62. The magnet pairs 34$_i$ and 34$_o$ are able to control the plasma formed in spaces 68 and 70 between the magnet bands by forming magnetic fields in the space near the bottom 16a of the target 16.

In the arrangement of magnet pairs 34$_i$, 34$_o$ shown in FIG. 11, the outermost magnet part forms a ring-shaped magnet band 60, while the inner magnet parts form ring-shaped magnet bands 62, 64, and 66. In this case, the total magnetic flux of the inner magnet bands 62, 64, and 66 can be derived by summing the magnetic flux of the magnetic poles different from those of outermost magnet band 60 with respect to the target and subtracting the magnetic flux of the same magnetic poles as the peripheral magnet part. For the inner ring-shaped magnet group, it is also possible to adopt a configuration comprising the outer magnet band 64 and the inner magnet band 66. Similarly, in the outer magnet group, it is also possible to adopt a configuration comprising the outer magnet band 60 and the inner magnet next band 62. In either case, a closed magnetic field is formed inside, and the electron density can be increased by this magnetic field.

In the sputtering device explained above, each magnet pair 34 controls the shape of the magnetic field B formed in the processing space in the vacuum chamber (referred to as sputtering space hereinafter) between the consumable target surface 16a and the top 18a of the pedestal 18. A suitable magnetic field for confining electrons in the sputtering spaced can be generated by these magnets. Since the magnetron 30 is rotated by the drive motor 36, the magnetic field generated by each magnet pair 34, 34$_i$ and 34$_o$ actually rotates at a speed in the range of 60–100 rpm around the axis of the drive shaft 38. As a result, the consumable target surface 16a can be sputtered nearly uniformly. The material of the target used in the sputtering device disclosed in the present embodiment is not limited to copper (Cu). It is also possible to use titanium (Ti), aluminum (Al), or their alloys. Alloying is typically limited to 10 atomic %.

When the processing gas is ionized near the consumable target surface 16a, particles are sputtered from the consumable surface 16a of target. If the magnet pairs 34 are arranged as shown in FIGS. 2 and 4–7, the sputtering uniformity of consumable surface 16a can be increased. Also, if the region where the plasma is generated is reduced, the plasma density can be increased without an increase in target power. As a result, the electron current density can be increased. Consequently, ionization of the sputtered particles can be increased. The ionized sputtered particles are accelerated toward substrate support part 18. As a result, the velocity component perpendicular to the substrate 15 becomes relatively large with respect to the velocity component parallel to the substrate, and the bottom coverage is thereby improved.

Also, when the velocity component perpendicular to the substrate is increased, a film can be formed directly below the rotating magnetron 30. Consequently, the non-uniformity of the film thickness due to the sputtered particles which are incident from an oblique lateral direction of the substrate surface can be reduced. Such non-uniformity results from a peripheral substrate position seeing less of the target in a wide-angle view than does a central substrate position.

Figure 12:
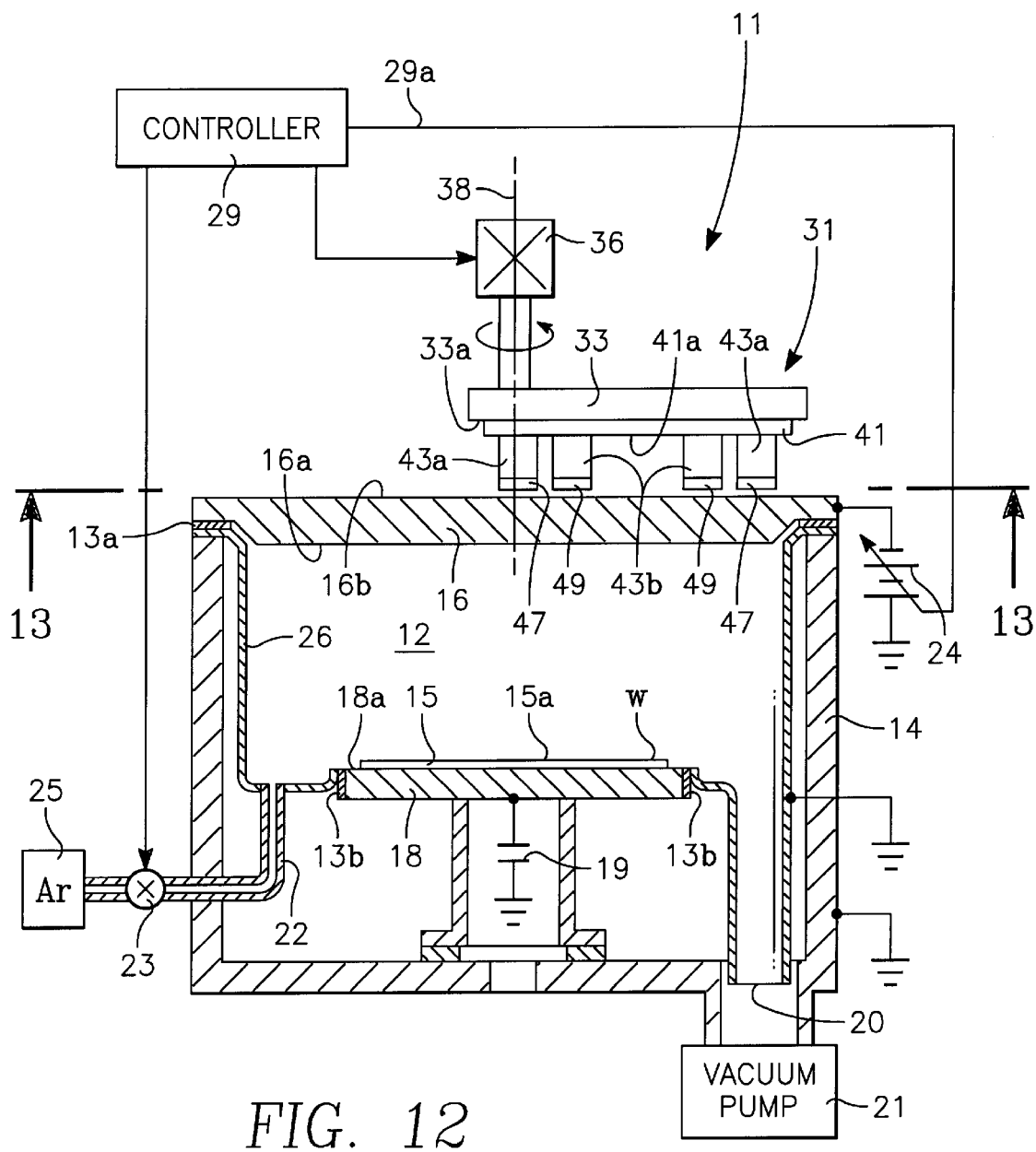
FIG. 12 is a schematic diagram cross-section illustrating the configuration of another embodiment of the magnetron type sputter reactor of the present invention using rod magnets.
Figure 13:
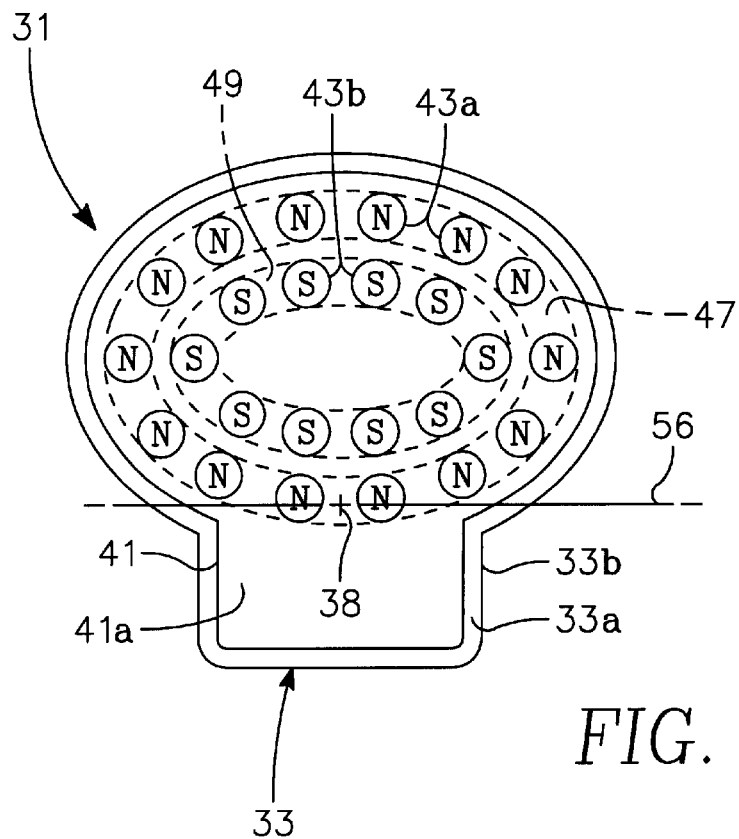
FIGS. 13 and 14 are bottom plan views of the arrangement of the rod magnets of FIG. 12 into either a radially flattened oval shape or a circular shape.

FIG. 12 shows a sputtering reactor 11 according to a different embodiment which is more easily manufactured and provides additional flexibility in design. In the sputtering reactor, it is possible, although not necessary to use the same parts as those with the same reference numbers appearing in the sputtering reactor 10 in FIG. 1. In FIG. 12, a magnetron 31 is used instead of the magnetron 30 of FIG. 1. FIG. 13 is a plan view illustrating a radially flattened oval arrangement for the magnetron 31, while FIG. 14 is a plan view illustrating an alternative round arrangement.

Figure 14:
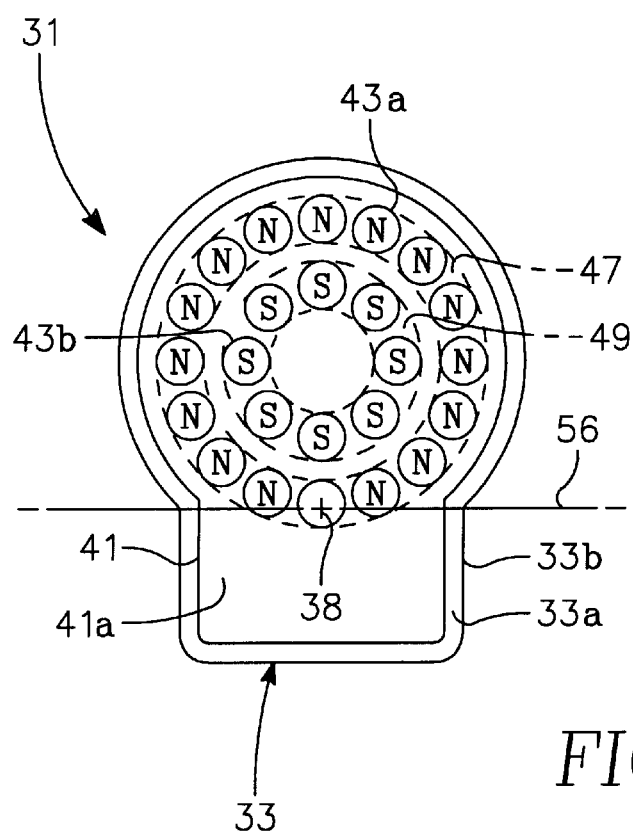

With reference to FIGS. 12, 13, and 14, the magnetron 31 includes a base plate 336, a magnetic cover 41 placed on a placement surface 33a of the base plate 336 and made of magnetic yoke material, and a plurality of magnets 43a, 43b of opposed magnetizations N$_g$S placed in a designated arrangement on the placement surface 41a of the magnetic cover 41. The base plate 336supports the magnetic cover member 41. Hence, the magnetic member 41 rotates along with the rotation of the rotational shaft 38 provided in the center of the top surface of the base plate 336. Preferably, the base plate 336 is formed with a rectangular tab 33 on the side near the target center 38, thereby providing additional mechanical strength and some counterbalancing.

In FIG. 12, the base plate 336 and magnetic cover 41 are illustrated as separate parts, but if the base plate itself is composed of magnetic yoke material, then the base plate 336 can serve both functions, which is favorable, and the magnetic cover can be eliminated.

The sputter target 16 is arranged so that the substrate supporting surface 18a of the support pedestal 18 opposes the erosion surface 16a of the target 16. The magnetron 31 has first magnet portions disposed on an opposite side of the target 16 with respect to the support pedestal 18 so as to generate a magnetic field inside the vacuum chamber.

In the radially flattened oval arrangement of FIG. 13, a plurality of magnets 43a of one magnetic polarity are arranged along a first annular member 47, each of these magnets 43a having one magnetic pole (the north (N) pole being illustrated in FIG. 13) facing the target 16 and the other magnetic pole (the S-pole in FIG. 13) facing the magnetic cover 41. Additionally, a plurality of magnets 43b of the other magnetic polarity are arranged along the second annular member 49, these magnets having one magnetic pole (the S-pole) facing the target 16 and the other magnetic pole (the N-pole) facing the magnetic cover 41.

In the embodiment of FIG. 13, the first and second annular members 47, 49 have oval shapes which are radially flattened with respect to the center 38 of the target 16. That it, they have minor axes extending along the target radius and major axes transverse to that radius. Also, the first annular member 47 encloses the second annular member 49 and extends from the target center 38 to its periphery. Alternatively, in the embodiment of FIG. 14, the first and second annular members member 47, 49 are both shaped as circles, that is, ovals with equal major and minor axes, and the magnets 43a, 43b are similarly arranged in circles.

The first and second annular members 47, 49 can be magnetic members such as pole pieces. In this case, the bottom ends of the magnets 43a having the same first magnetic polarity are magnetically coupled by the first annular member 47, and the bottom ends of the magnets 43b of the second magnetic polarity are magnetically coupled by the second annular member 49.

In the magnetron 31 of either FIG. 13 or 14, all of the magnets 43a, 43b form a single magnetic circuit by means of the magnetic cover 41 (or magnetic support plate 31) and the pole pieces 47, 49.

In either magnetron 31, the magnetic cover 41 has a placement surface 41a which is larger than the size of a substrate, e.g. the diameter of a wafer. The magnetic cover 41 is placed between all of the magnets 43 and the base plate 33. Additionally, the magnetic pole pieces 47, 49 are placed between all of the magnets 43a, 43b and the target 16. As a result, a magnetic field from the annularly arranged magnets is applied to the target 16 o through the magnetic pole pieces 47, 49.

That is, the magnetic members 41, 47 and 49 function as a combined magnetic coupling means. The magnetic cover 41 magnetically couple the N poles (first magnetic pole) of a plurality of first magnets 43a included in an outer array with the S poles (second magnetic pole) of a plurality of second magnets 43b included in an inner array. The outer magnetic pole piece 47 magnetically couples together the N poles of the plurality of first magnets 43a included in the outer array, and the inner magnetic pole piece 49 magnetically couples together the S poles of the plurality of second magnets 43b included in the outer array. That is, this magnetic coupling means has means for magnetically o coupling the S poles of a plurality of first magnets with the N poles of a plurality of second magnets, and means for magnetically coupling together the N poles of a plurality of first magnets or means for magnetically coupling together the S poles of a plurality of second magnets.

The magnet arrangements of FIGS. 4, 6 and 7 can likewise be applied to the sputtering apparatus 11. As a result, a variety of desired effects can be obtained. In the respective drawings, the outer magnets 43a situated along the first annular member 47 correspond to the outer magnet portion 52, and the inner magnets 43b situated along the second annular member 49 correspond to the inner magnet portion 54.

In the sputtering apparatus 11, it is possible to use separate magnets having a designated and set magnetic force for each of the plurality of magnets 43a, 43b positioned along the first and second annular members 47, 49. By employing identical separate magnets, the total magnetic force of the magnet portion composed of the first annular band and the magnet portion composed of the second annular band can be determined simply from the number of magnets, thus enabling the overall magnetic ratio to be readily set.

The magnetron 31 is such that the placement surface 33a of the base plate 33 has, for example, a first and second half-space separated by a plane containing the central axis 38 of rotation 38, the inner magnet band being provided in the first half-space and the o outer magnet portion being provided either on the border between the first and second half-spaces or in the first region.

In the magnetron 31, the inner magnet band should preferably be completely located in the first half-space and the outer magnet portion located so as to pass through the border between the first and second regions and in the first region. Additionally, the outer magnet band may pass through a position corresponding to the center of rotation 38. In particular, in the embodiment shown in FIG. 12, the region between the outer and inner magnetic pole piece 47, 49 overlaps only with the first half-space.

According to this magnet arrangement, it is possible to reduce the region on the target erosion surface 16a on which the plasma is formed. Since power can be applied to a smaller region of the target in this way, the plasma density can be raised without increasing the applied power. When the plasma density rises, the electron density also increases, thus promoting the ionization of sputtered particles. Since the ionized sputtered particles accelerate toward the substrate surface, a large number of sputtered particles having velocity components in the direction of the substrate surface are generated. Therefore, the sputtered particles mainly reach a location directly under the plasma region, thereby promoting film formation in this reached region. Thus, the uniformity of the film thickness can be increased while also improving the bottom coverage.

In the sputtering apparatus 11, the magnet bands can be positioned so as to provide a magnetic field along their respective closed lines. Near the erosion surface 16a, plasma is generated in the region between the closed lines. That is, the shape and area of the region in which the plasma is generated is defined by the two closed lines. The closed lines may be closed curves. Additionally, the closed lines are preferably convex curves. These curves can be provided in the first region of the magnetron, or may pass through the center of rotation 38.

Additionally, in the magnetron 31, when the outer magnet band is located on the outer peripheral line of a designated convex shape, the shape of the magnetic field contributing to the generation of plasma is defined by this convex shape. The range of change in the curvature of the isomagnetic lines based on this closed convex line which is the outer perimeter line of the convex shape can be made smaller than the range of change in the curvature of the closed curve. As a result, the leakage of electrons from the plasma is reduced, and electrons can be confined efficiently.

When the electron density increases, the ionization of sputtered particles is promoted, and the ionized sputtered particles are accelerated in the direction of the substrate, so that the velocity component in this direction becomes large. Additionally, when the electron density in the plasma increases, the pressure of the processing gas may be reduced. By reducing the pressure, the probability of collision between the sputtered particles and processing gas can be lowered, thus increasing the number of sputtered particles having velocity components in a direction perpendicular to the substrate. Due to these reasons, the bottom coverage is improved. The outer magnet portion should preferably be composed of magnets arranged on the outermost perimeter. As a result, electrons can be confined to inside the outermost magnet portion.

Figure 15:
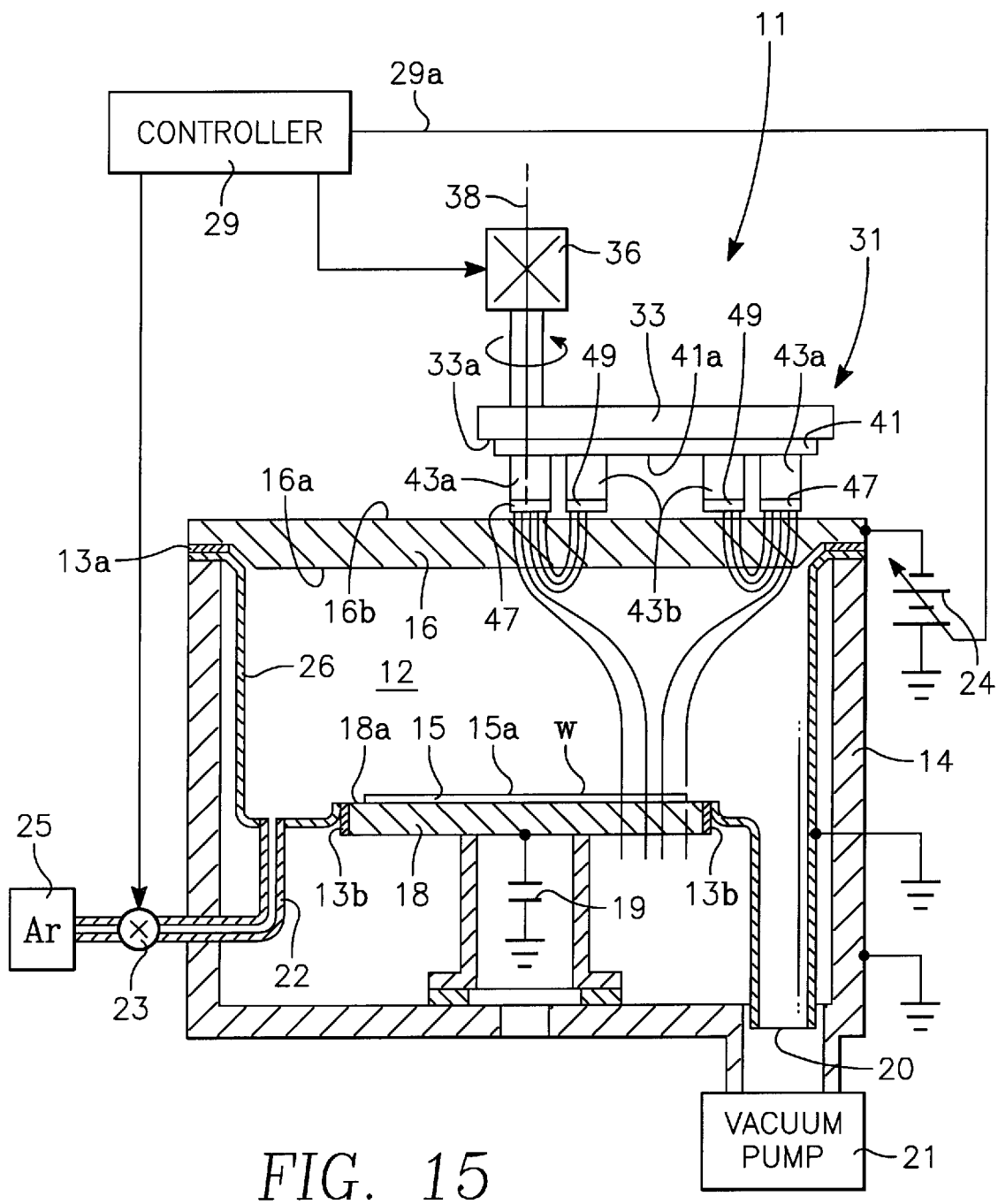
FIG. 15 is a schematic cross-sectional diagram illustrating a magnetic field formed in the sputter reactor of FIG. 12.
Figure 16:
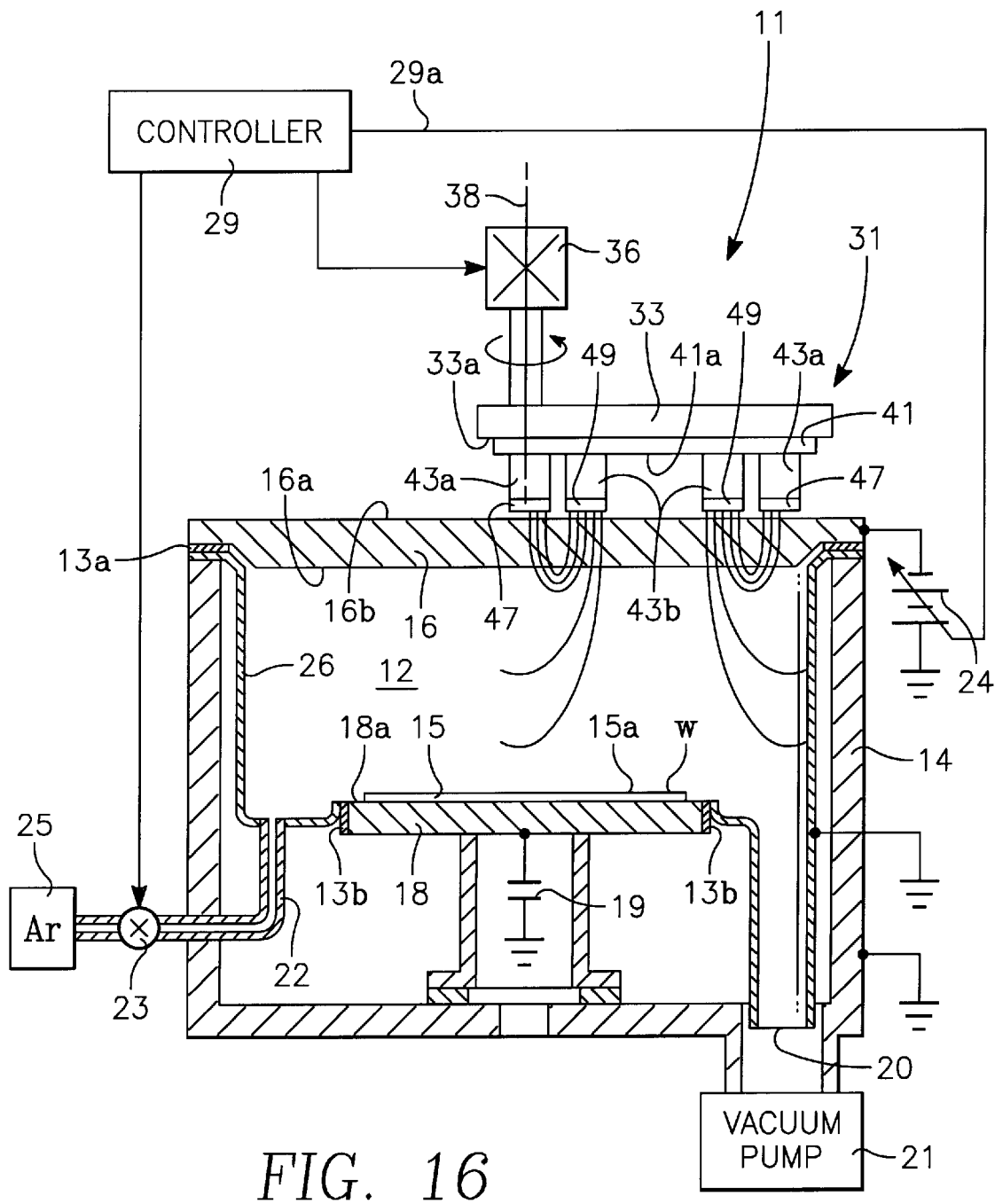
FIG. 16 is a schematic cross-sectional diagram illustrating the magnetic field formed in a sputter reactor with the opposite magnetic imbalance as that of FIG. 12.

FIG. 15 schematically illustrates the magnetic field generated by the magnetron 31 when the total magnetic force of the inner magnet band is smaller than the total magnetic force of the outer magnet band. On the other hand, FIG. 16 schematically illustrates the magnetic field generated by a magnetron when the relationship between total magnetic force is opposite to that of FIG. 15. In FIGS. 15 and 16, the magnetic fields generated by the magnetron 31 are indicated by dashed lines.

In the sputtering apparatus of FIG. 15, the magnetic force lines from the N poles of the outer magnets 43a contained in the outer magnet band (52 in FIGS. 4, 6 and 7) extend toward the center of the magnetron 31. A portion of the magnetic field reaches the S poles of the inner magnets 43b, passing through the magnetic cover 41 (or magnetic support plate 33) and closing to form a magnetic circuit. The remaining magnetic field extends toward the center of the magnetron 31 to near the central axis, then changes directions in this axial direction to extend to the opposite side of the magnetron 31. Hence, the magnetic field from the outer magnets 43a faces toward the inside of the magnetron 31 near the erosion surface 16a. Depending on the curvature of the magnetic field, the direction of movement of the electrons turns to the inside of the magnetron. For this reason, the flow of electrons to the shield 26 can be made small.

On the other hand, in the sputtering apparatus of FIG. 16, the magnetic field generated by the inner magnet portion faces the outside of the magnetron 30 and passes through the grounded shield 26. Hence, the action of the magnetic field to confine the plasma away from the shield 26 is weak.

In a sputtering apparatus such as explained above, the magnetrons 30, 31 respectively control the shapes of the magnetic fields B formed in the space (hereinafter referred to as sputtering space) inside the vacuum chamber 12 between the erosion surface 16a and the top surface 18a of the pedestal 18. The magnetron 30 or 31 generates a magnetic field suitable for confining electrons in the sputtering space. The magnetrons 30, 31 are rotated by a drive motor 36, so that the magnetic field generated by the magnets is rotated at a frequency, e.g. of about 60–100 times per minute around the drive shaft 38 in the actual sputtering apparatus 10, 11.

Figure 17:
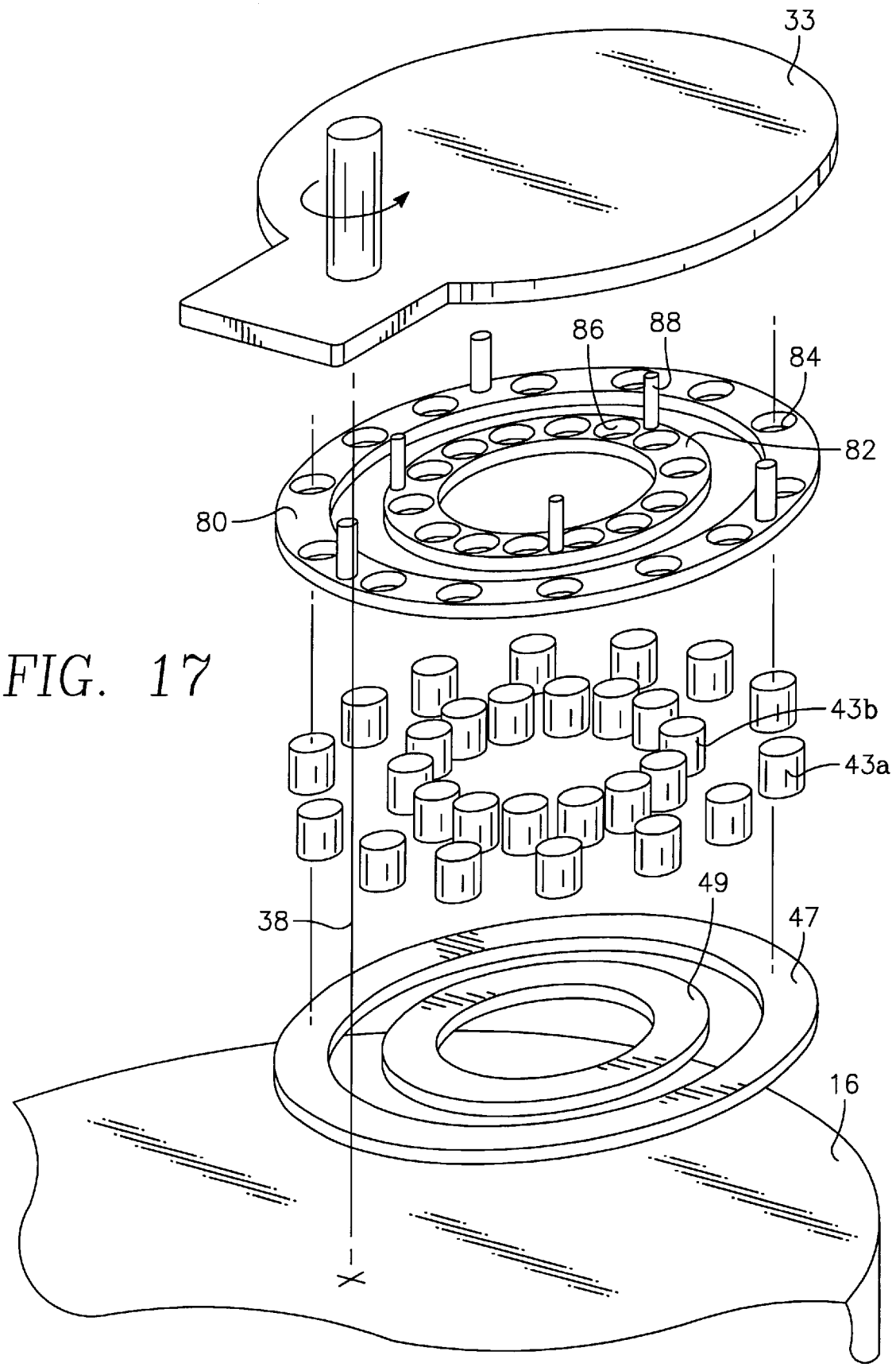
FIG. 17 is an orthographic view of another embodiment of a magnetron of the invention.

A more specific and preferred embodiment of the invention is illustrated in the orthographic view of FIG. 17. In conjunction with FIGS. 14, a magnetron 11 includes the magnetic baseplate 33 rotating about the central axis 38 and magnetic pole pieces 47, 49 sandwiching the magnets 43a, 43b, all in the shape of cylindrically shaped rods. An outer alignment belt 80 and an inner alignment belt 82 of non-magnetic materials each have a plurality of respective alignment holes 84 and 86 to align and hold therein the magnets 43a, 43b. The illustrated alignment belts 82, 84 are circular, but they may be oval, as in FIG. 13. Fasteners 88 fix the alignment belts 82, 84 to the base plate 33, and unillustrated fastening means such as screws fix the pole pieces 47, 49 to the base plate 33. The magnetic baseplate 33, the magnets 43a, 43b, and the magnetic pole pieces 47, 49 are magnetically coupled together to form a magnetic circuit.

Figure 18:
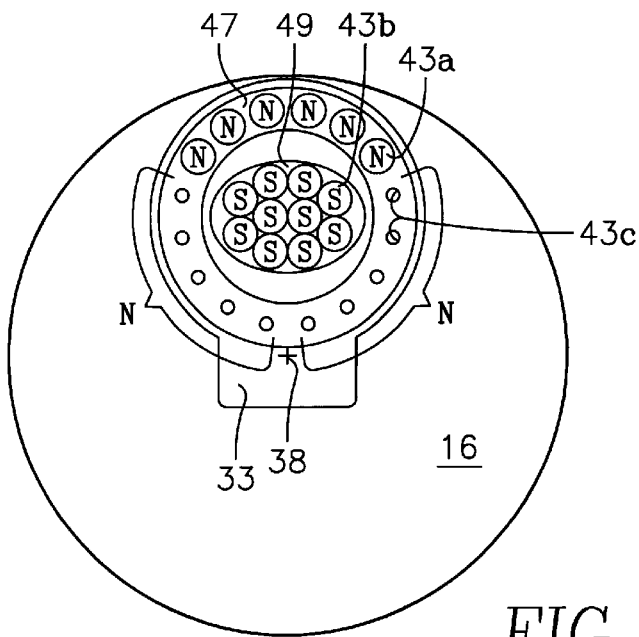
FIG. 18 is a bottom plan view of an alternative arrangement of magnets including magnets of different sizes.

A variant of the embodiment of FIG. 17 has a magnet arrangement illustrated in the bottom plan view of FIG. 18. This embodiment uses two sizes of magnets. A first size, used for the tangentially disposed outer magnets 43a and the inner magnets 43b, has a large diameter, for example, 1.7 cm, while a second size, used for radially inward outer magnets 43 has a smaller diameter, for example 1.4 cm. The heights of the two sizes of magnets is the same, for example, 3.3 cm. The large sized magnets, made of NdFeB, produce a magnetic field of approximately 150 to 200 gauss at a location 2 cm from the end of the large magnet. The corresponding magnetic field for a small magnet is 1.4/1.7 or 82% of this value. The magnet material may alternatively be SmCo, AlNiCo or ferrite.

As illustrated in FIG. 18, six large magnets 43a of a first magnetic polarity are disposed on the outer pole piece 47 near the periphery of the target 16 away from the target center and eighteen small magnets 43c of the first magnetic polarity are disposed on the outer pole piece 47 closer to the target center 38, nine small magnets 43c being disposed on each side of the six large magnets 43a. The magnets 43a, 43c are arranged in a circular pattern. On the other hand, ten large magnets 43b of a second magnetic polarity are disposed on the inner pole piece 49 in an oval pattern. A non-magnetic alignment collar holds all the magnets 43a, 43b, 43c at their respective positions. A circularly shaped annular magnetic pole piece is attached to the outer magnets 43a, 43c, while an oval shaped pole piece having no aperture is attached to the inner magnets 43b to accommodate the arrangement of the inner magnets in a radially flattened oval shape. The combination of circular outer magnet band and oval inner magnet area results in a non-constant gap.

The location of the larger outer magnets 43a near the target periphery is advantageous in two respects. The stronger magnetic imbalance near the target periphery creates a stronger magnetic field extending parallel to the grounded shield, thereby reducing the plasma leakage to the shield. Also, the magnetic field is more strongly confined to the region of the magnetron near the target periphery and away from the target center, thereby reducing the effective area of the magnetron and increasing the effective target power density and also reducing the sputtering rate at the target center, which is always be sputtered as the magnetron is rotated.

When the processing gas from the magnetrons 30, 31 is excited into a plasma near the erosion surface 16a, sputtered particles from the erosion surface 16a of the target 16 are formed. By employing an arrangement of the magnetron such as in FIGS. 2, 4, 6, 7, 13, and 14, it is possible to lower the pressure required to maintain a plasma. Additionally, it is possible to raise the plasma density by reducing the region in which the plasma is generated. As a result, the electron current density can be increased. As a result, the ionization of sputtered particles is promoted. The ionized sputtered particles are accelerated in the direction of the substrate support pedestal 18. Consequently, the velocity component along the direction of the axis intersecting the substrate W become larger than the velocity component in the direction perpendicular thereto, thereby improving the bottom coverage. Additionally, when the velocity component perpendicular to the substrate W becomes larger, film formation progresses directly underneath the area where the rotating magnetrons 30, 31 pass, so that a film with good bottom coverage is formed.

In a sputtering apparatus of this type, according to results of experiments performed by the inventors, a film thickness uniformity of at least 10% in a conventional apparatus was reduced to 5% or less by applying the present invention. Here, the film thickness uniformity can be defined as the difference between the maximum and minimum measured film thickness divided by twice the average film thickness.

According to experiments performed by the inventors on the sputtering apparatus mentioned above, it is preferable to set the total magnetic flux of the outer magnet portion to 1.5 times the total magnetic flux force of the inner magnet portion for practical purposes. In the case where the magnets are of the same magnetic composition, the ratio of magnetic flux can be determined by the ratio of total cross-sectional areas of the oppositely polarized magnets.

Figure 19:
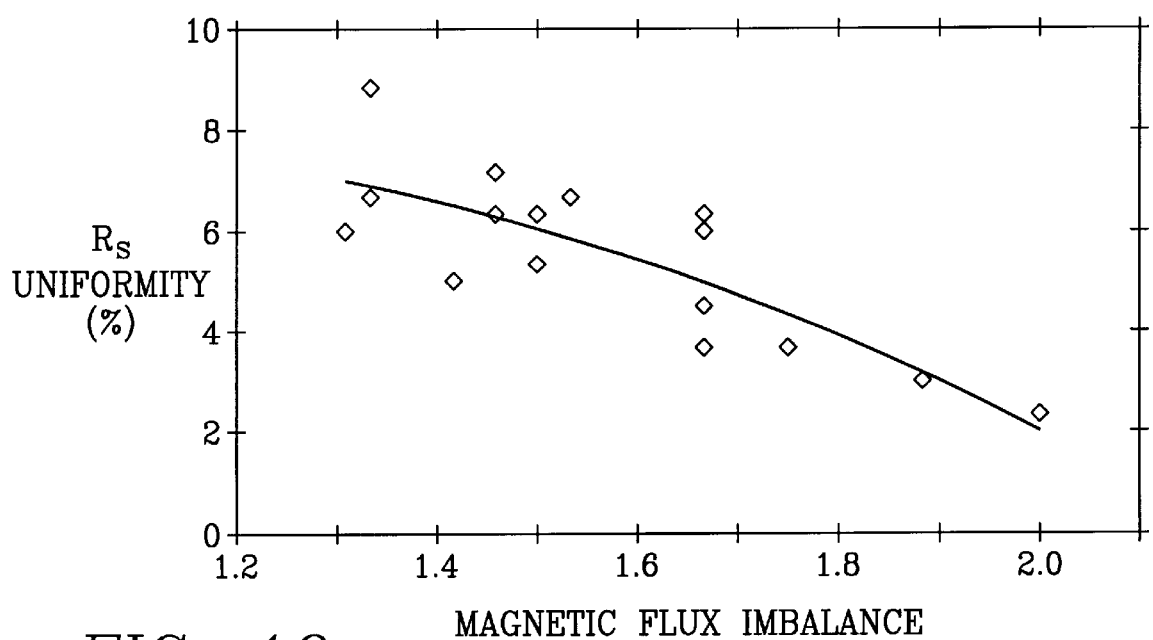
FIG. 19 is a graph plotting the uniformity of sheet resistance as a function of magnetic imbalance.

FIG. 19 shows the experimental results which plots the uniformity of $R_s$ (sheet resistance) on the vertical axis against the total magnetic imbalance on the horizontal axis, that is, the total magnetic flux ratio between the outer and inner bands. The sheet resistance $R_s$ is closely related to the film thickness so the $R_s$ uniformity substantially equals the thickness uniformity.

These measurements were performed under the following conditions:
Target: Ti
Power: 12 kW
Pressure: $6.67 \times 10^{-2}$ Pa (0.5 mT)
Film Thickness: 100 nm According to FIG. 19, there is a tendency for the $R_s$ uniformity to worsen if the total magnetic flux ratio is less than 1.5, whereas the $R_s$ uniformity is improved as the total magnetic flux ratio increases when the total magnetic force ratio is 1.5 or more.

Additionally, as far as the inventors are aware, conventional sputtering apparatus are not capable of maintaining a plasma if the pressure of the processing gas is 0.05 Pa (0.375 mTorr) or less. However, in a sputtering apparatus such as that described above, the minimum discharge maintaining pressure was able to be lowered to 0.02 Pa (0.15 mTorr). At such a low pressure, the bottom coverage was increased to at least 1.5 times that in conventional devices.

As described above, FIGS. 2, 4, 6, 7, 13, and 14 show magnet arrangements which are applicable to the first and second embodiments. In these arrangements, the magnet portions, for example the magnet portion 52, is provided in the form, for example, of a pole piece along a designated closed curve.

In this type of magnetron, the inventors believe that it is favorable for the minimum radius of curvature of the closed curve to be at least 0.8 times the maximum radius of curvature, and the minimum radius of curvature of the convex curve to be at least 0.8 times the maximum radius of curvature. If outer magnet portions are arranged along the designated closed curve, the shape of the magnetic field contributing to the generation of plasma is defined by this closed curve. Since isomagnetic lines curve within the range of the above-described radii of curvature, the leakage of electrons from the plasma which may curve due to isomagnetic lines will be reduced. The inner magnets can obtain even more favorable results if fulfilling the conditions for radius of curvature described above. In particular, the circular magnet arrangement shown in FIG. 14 gives the best results.

In a sputter reactor with a conventional magnetron, the variation in film thickness is usually 10% or higher. According to the results of the experiments carried out by the present inventors, however, with the magnetron of the present invention, the variation in film thickness can be improved to 5% or less. In this case, the variation in film thickness is defined as the difference between the measured value at the thickest point and measured value at the thinnest point divide by half the average of the film thickness.

According to the experiments carried out by the present inventors, it is preferred to set the total magnetic flux of the magnet band to be at least 1.5 times that of the inner magnet band for practical usage.

To the best knowledge of the present inventors, in a conventional sputtering device, the plasma cannot be maintained when the pressure of the processing gas drops to 0.05 Pa (0.375 mtorr) or less. In the aforementioned sputtering device, however, the lowest pressure required for maintaining plasma discharge can be reduced to 0.02 Pa (0.15 mtorr) or less. At such low pressures, the bottom coverage can be improved by at least 1.5 times compared with the conventional case.

A film-forming method suitable for the aforementioned sputtering device can be carried out in the following sequence. First, a sputtering device equipped with a first magnet part arranged with the first magnetic pole aimed at a target made of a prescribed material and a second magnet part arranged outside the aforementioned first magnet part with the second magnetic pole aimed at the target is prepared. The magnetic flux density of the peripheral magnet part is greater than that of the inner magnet part. Then, a substrate is suitably arranged to face the target. A working gas is then supplied to the vacuum chamber to generate a plasma the plasma sputters particles from the target. The sputtered particles are deposited on the substrate to form a film made of a prescribed material. When the particles generated by means of sputtering are deposited sequentially on the surface of the substrate, a film with good bottom coverage can be formed on the substrate. The method also may be practiced in a sputtering device equipped with a magnetron having magnets arranged in one of the regions divided by a plane that includes the rotary shaft of the magnetron.

A magnetic field is formed in the central region and in one of the regions of the consumable surface that is divided by a plane that includes the rotation central shaft of the magnetron, and a film is formed when the magnetron is rotated to move the magnetic field over the consumable target. As a result, the sputtering uniformity of the consumable surface can be increased, and the region where the magnetic field is formed can be reduced. Consequently, the plasma forming region is reduced. In this way, the electron density can be increased without increasing the input power. The ionization of the sputtered particles is increased by the increased density of electrons, and the ionized particles are accelerated toward the surface of the substrate. Consequently, most of the sputtered particles reach the region directly below the plasma region.

If the aforementioned magnetron is prepared as described above, the electrons in the plasma can be efficiently confined by the electron-trapping effect of the magnetic field. As a result, the electron density can be increased. When the electron density is increased, the sputtered particles are more readily ionized. Since the ionized sputtered particles are accelerated by the electric field, the number of sputtered particles that move toward the substrate is increased. Consequently, most of the sputtered particles reach the substrate directly below the plasma region. Therefore, the film thickness uniformity can be improved.

Also, since the pressure of the working gas can be reduced, the vacuum level within sputtering space can also be reduced by as much as the partial pressure equivalent to the reduced flow rate of the working gas. As a result, the frequency of collision of the working gas particles with the sputtered particles can be reduced. Therefore, the bottom coverage rate can be further improved.

As explained in detail above, according to one aspect of the present invention, the magnetron has a first magnet band and a second magnet band suitably arranged to generate a magnetic field in the vacuum chamber. The second magnet band is arranged outside the first magnet band, and the total magnetic flux of the first, inner magnet band is less than that of the outer, second magnet band.

Since the first magnet band that produces a lower magnetic flux density is arranged to the inside of the second magnet band that produces a greater magnetic flux, some of the lines of magnetic flux of the outer second magnet band reach over the inner first magnet band, pass through the interior magnet-free of the outer first magnet band, and, after passing through the magnetic yoke, are confined in the second magnet band. The remaining lines of magnetic flux of the second magnet band form a magnetic flux loop that enclose the first magnet band and terminates at the second magnet band. Consequently, since the magnetic flux that extends to the outside of the vacuum chamber can be reduced, the electron-confining ability can be improved. By using the film-forming method of the present invention, a film can be formed after a magnetic field with excellent electron-confining ability is generated. Consequently, the present invention provides a sputtering device and a film-forming method which can improve bottom coverage.

Further as explained above, according to another aspect of the present invention, a magnetron is arranged with a region facing the sputtering target. The magnetron has a magnet band arranged in one of the facing regions that is divided by a plane that includes the rotary shaft. The drive means uses a shaft that passes through a prescribed point on the aforementioned consumable surface as the rotation center and is able to rotate the aforementioned magnetron relative to the sputtering target. Since the magnet band is arranged in one of the facing regions in the sputtering device, the shape of the region where the magnetic field is to be formed can be simplified, and the sputtering uniformity on the consumable surface as well as the uniformity of the film thickness can be guaranteed. Also, since the magnet band can be arranged in one of the separated facing regions, the sputtering uniformity can be increased, and the region near the consumable target surface where the plasma is formed can be reduced. Since power can be applied to the reduced region, the plasma density can be increased without raising the input power. When the plasma density is increased, the electron density is also increased. As a result, the ionization of the sputtered particles can be increased. Since the ionized sputtered particles are accelerated toward the surface of the substrate, the number of sputtered particles having a velocity component in the direction of the surface of the substrate can be increased. Consequently, most of the sputtered particles reach the region directly below the plasma region, and a film can be formed in the region reached by the electrons. Therefore, the uniformity of the film thickness and the bottom coverage can be improved. According to the film-forming method of the present invention, a film can be formed with a magnetic field generated near the rotation center and in one of the regions on the magnetron that is divided by a plane that includes the rotary shaft. Consequently, the present invention provides a sputtering device and a film-forming method which can improve the in-plane uniformity of the film thickness.

What is claimed is:

1. A magnetron sputter reactor, comprising:
   a vacuum chamber;
   a substrate support positioned in said chamber;
   a sputtering target facing said support; and
   a magnetron positioned on a side of said target opposite said support and including
      a first ring-shaped magnet band formed from a first plurality of first magnets of a first magnetic polarity and producing a first total magnetic flux of said first magnetic polarity on a first side facing said target, and
      a second ring-shaped magnet band enclosing said first magnet band, formed from a first plurality of second magnets of a second magnetic polarity opposite said first magnetic polarity, and producing a second total magnetic flux of said second magnetic polarity on a second side facing said target,
         wherein said second total magnetic flux is greater than said first total magnetic flux.

2. The reactor of claim 1, wherein said first magnet band encloses an aperture substantially free of permanently magnetized material.

3. The reactor of claim 2, wherein some magnetic field lines originating from said second magnet band pass through said aperture without touching said first side of said first magnet band.

4. The reactor of claim 1, wherein said first and second magnet bands are separated by a substantially constant gap.

5. The reactor of claim 1, wherein said second total magnetic flux is at least 1.5 times said first total magnetic flux.

6. The reactor of claim 1 further comprising a first plurality of magnetic yokes supporting and magnetically coupling respective pairs of said first and second magnets.

7. The reactor of claim 1, further comprising:
   at least one first magnetic pole piece arranged on said first side of and magnetically coupling all of said first magnets; and
   at least one second magnetic pole piece arranged on said second side of and magnetically coupling all of said second magnets.

8. The reactor of claim 1, wherein said second magnet band has an oval shape with a major axis and a minor axis no smaller than 0.8 times said major axis.

9. The reactor of claim 8, wherein said major and minor axes are substantially equal, thereby producing a circular shape.

10. The reactor of claim 1, wherein said magnetron is rotatable about a center of said target.

11. A magnetron sputter reactor, comprising:
    a vacuum chamber;
    a substrate support positioned in said chamber;
    a sputtering target facing said support; and
    a magnetron positioned on a side of said target opposite said support and including
       a first magnet band producing a first total magnetic flux of a first magnetic polarity on a first side facing said target, and
       a second magnet band enclosing said first magnet band and producing a second total magnetic flux of a second magnetic polarity opposite said first magnetic polarity on a second side facing said target,
          wherein said second total magnetic flux is at least 1.5 times said first total magnetic flux.

12. The reactor of claim 11, wherein said second magnets are arranged in a shape of a ring surrounding said first magnets.

13. A magnetron sputter reactor, comprising:
    a vacuum chamber;
    a substrate support positioned in said chamber;
    a sputtering target facing said support; and
    a magnetron positioned on a side of said target opposite said support and including
       a first magnet band producing a first total magnetic flux of a first magnetic polarity on a first side facing said target, and
       a second magnet band enclosing said first magnet band and producing a second total magnetic flux of a second magnetic polarity opposite said first magnetic polarity on a second side facing said target, wherein said second magnet band is principally disposed in a first half area of said target separated from a second half area of said target by a line passing through a center of said target
          wherein said second total magnetic flux is greater than said first total magnetic flux; and
          wherein said first magnet band does not extend into said second half area and wherein said second magnet band extends into said second half area but no further than 15% of a radius of said target from said center of said target.

14. A magnetron sputter reactor, comprising:
    a vacuum chamber;
    a substrate support positioned in said chamber;
    a sputtering target facing said support; and
    a magnetron positioned on a side of said target opposite said support and including
       a first magnet band producing a first total magnetic flux of a first magnetic polarity on a first side facing said target, wherein said first magnet band encloses an aperture formed of a non-magnetic material, and
       a second magnet band enclosing said first magnet band and producing a second total magnetic flux of a second magnetic polarity opposite said first magnetic polarity on a second side facing said target.

15. A magnetron sputter reactor, comprising:
    a vacuum chamber;
    a substrate support positioned in said chamber;
    a sputtering target facing said support; and
    a magnetron positioned on a side of said target opposite said support and including
       a first magnet band producing a first total magnetic flux of a first magnetic polarity on a first side facing said target, wherein said first magnet band encloses an aperture formed of a non-magnetic material, and
       a second magnet band enclosing said first magnet band and producing a second total magnetic flux of a second magnetic polarity opposite said first magnetic polarity on a second side facing said target;
          wherein said second total magnetic flux is greater than said first total magnetic flux.

16. A magnetron sputter reactor, comprising:
    a vacuum chamber;
    a substrate support positioned in said chamber;
    a sputtering target facing said support and having a center axis; and
    a magnetron positioned on a side of said target opposite said support, rotatable about said center axis of said target and including a first magnet band producing a first total magnetic flux of a first magnetic polarity on a first side facing said target, wherein said first magnet band encloses an aperture substantially free of permanently magnetized material, and a second magnet band enclosing said first magnet band and producing a second total magnetic flux of a second magnetic polarity opposite said first magnetic polarity on a second side facing said target, wherein said second magnet band passes through said center axis or passes within a distance of said center axis of no more than 10% of a radius of said target.

17. The reactor of claim 16, wherein said second total magnetic flux is greater than said first total magnetic flux.

18. The reactor of claim 16, wherein said first magnet band is confined to a first semi-circular half area of said target and said second magnet band extends into a second semi-circular half area of said target by no more than 15% of a radius of said target, said two half areas being separated by a boundary passing through said center axis.

19. The reactor of claim 16, wherein said second magnet band passes through said center axis.

20. A magnetron sputter reactor, comprising:

a vacuum chamber;

a substrate support positioned in said chamber;

a sputtering target facing said support and having a target radius extending from a target center to a target periphery; and a magnetron positioned on a side of said target opposite said support, rotatable about said target center, and including a plurality of first cylindrical magnets of a first magnetic polarity and having a first diameter arranged along a first portion of an oval band extending from a point within 15% of said target radius from said target center toward said target periphery;

a plurality of second cylindrical magnets of said first magnetic polarity and having a second diameter less than said first diameter arranged along a second portion of said oval band closer to said target center than said first portion; and a plurality of third cylindrical magnets of a second magnetic polarity opposite said first magnetic polarity disposed inside said first portion of said oval band.

21. The reactor of claim 20, wherein a total cross-sectional area of said first and second magnets is at least 150% of a total cross-sectional area of said third magnets.

22. The reactor of claim 20, wherein said third magnets have a third diameter equal to said first magnets.

23. The reactor of claim 20, wherein said oval band has a circular shape.

24. The reactor of claim 23, further comprising a non-circular oval pole piece magnetically coupling together free ends of said third magnets.

25. A magnetron sputter reactor, comprising:

a vacuum chamber;

a substrate support positioned in said chamber;

a sputtering target facing said support and having a target radius extending from a target center to a target periphery; and a magnetron positioned on a side of said target opposite said support, rotatable about said target center, and including a plurality of first magnets of a first magnetic polarity arranged in a closed band extending from a point within 15% of said target radius from said target center toward said target periphery and having a first total magnetic flux; and at least one second magnet of a second magnetic polarity opposite said first magnetic polarity disposed inside said first band and having a second total magnetic flux;

wherein said first total magnetic flux is at least 150% of said second total magnetic flux.

26. The reactor of claim 25, wherein said band has a convex shape.

27. The reactor of claim 26, wherein said convex shape is an oval shape having a major axis and a minor axis that is no less than 0.8 of said major axis.

28. The reactor of claim 27, wherein said major axis equals said minor axis.

29. The reactor of claim 25, wherein said target center is either coincident with said band or lies outside an outer periphery of said band.

30. A magnetron usable with a sputtering target, comprising:

a magnetic baseplate rotatable by a shaft aligned along a central axis positionable perpendicular to a principal face of said target;

a plurality of first magnets of a first magnetic polarity fixed to said baseplate and arranged in a first closed band pattern;

a first ring-shaped magnetic pole piece fixed to ends of said first magnets opposite said baseplate;

a plurality of second magnets of a second magnetic polarity opposite said first magnetic polarity fixed to said baseplate and arranged in a second closed band pattern surrounding said first magnets; and a second ring-shaped magnetic pole piece fixed to ends of said second magnets opposite said baseplate and surrounding said first magnetic pole piece.

31. The magnetron of claim 30, further comprising two non-magnetic alignment members fixed to said baseplate and having holes therethrough aligning and holding therein said first and second magnets.

32. The magnetron of claim 30, wherein a total magnetic flux of said second magnets is at least 1.5 times a total magnetic flux of said first magnets.

* * * * *